(12) United States Patent
Asai et al.

(10) Patent No.: US 6,409,159 B1
(45) Date of Patent: Jun. 25, 2002

(54) METHOD OF SUPPORTING PRINTED CIRCUIT BOARD AND METHOD OF MOUNTING ELECTRIC COMPONENTS

(75) Inventors: Koichi Asai, Nagoya; Shinsuke Suhara, Kariya, both of (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/204,311

(22) Filed: Dec. 3, 1998

(30) Foreign Application Priority Data

Jan. 9, 1998 (JP) ............................. 10-003076

(51) Int. Cl.[7] ................................. F16F 3/08
(52) U.S. Cl. ................ 267/152; 267/136; 248/636; 248/638; 361/600; 361/736; 361/748; 361/767; 361/807
(58) Field of Search .............. 267/182, 151, 267/152, 153, 136; 248/615, 618, 619, 638, 636; 361/600, 807, 652, 808, 673, 679, 719, 736, 748, 760, 767, 771

(56) References Cited

U.S. PATENT DOCUMENTS

| 3,889,936 A | 6/1975 | Shimizu |
| 4,159,505 A | 6/1979 | Carp et al. |
| 4,976,415 A | 12/1990 | Murai et al. |
| 5,711,065 A | * 1/1998 | Asai et al. ................ 29/740 |
| 6,161,811 A | * 12/2000 | Suhara et al. ............ 248/638 |
| 6,251,493 B1 | * 6/2001 | Johnson et al. ............ 428/71 |

FOREIGN PATENT DOCUMENTS

| EP | 0 014 391 A1 | 8/1980 |
| EP | 0 664 665 A1 | 7/1995 |
| EP | 0 783 241 A2 | 7/1997 |
| JP | A-6-104593 | 4/1994 |
| JP | 7-45995 | 2/1995 |
| JP | A-9-237997 | 9/1997 |
| JP | 11-214887 | * 8/1999 |

* cited by examiner

*Primary Examiner*—Pam Rodriguez
(74) *Attorney, Agent, or Firm*—Oliff & Berridge, PLC

(57) ABSTRACT

A method supporting a printed circuit board, including the step of causing a contact portion of at least one board supporting member including a vibration damping portion formed of a vibration damping rubber, to contact at least one portion of a lower surface of the printed circuit board and thereby support the printed circuit board on a side of the lower surface thereof.

19 Claims, 16 Drawing Sheets

METHOD OF SUPPORTING PRINTED CIRCUIT BOARD AND METHOD OF MOUNTING ELECTRIC COMPONENTS

BACKGROUND OF THE INVENTION

1. Field of the Invention

The present invention relates to a method of supporting a printed circuit board, a method of mounting electric components, and others, and in particular to the art of supporting a printed circuit board on the side of one surface thereof.

2. Related Art Statement

A printed circuit board ("PCB") is subjected to various operations, such as mounting thereon of electric components ("ECs") to produce an electric circuit (e.g., an electronic circuit); screen-printing thereon of a creamed solder; and application thereto of an adhesive by a dispenser. During the operation or each of the operations, the PCB may be supported on the side of one surface thereof opposite to the other surface thereof on which the operation or each operation is carried out. For example, in the case where the PCB has a large size and/or a low rigidity, a central portion of the PCB may sag down so that one or more ECs may not be accurately mounted thereon or the creamed solder may not be uniformly printed thereon. To avoid this, the above-indicated one surface (hereinafter, referred to as the "operation" surface) of the PCB is supported so that the opposite surface (hereinafter, referred to as the "supported" surface) thereof may be kept flat.

To this end, it has conventionally been practiced that the entire supported surface of the PCB is supported on a PCB support table by being sucked thereagainst, or that the PCB is supported on a plurality of iron pins. However, the former manner cannot be employed, for example, in a particular case where ones or more ECs have already been mounted on the supported surface of the PCB. On the other hand, the latter manner can be employed in the particular case, because the iron pins can be positioned to support respective small portions of the supported surface of the PCB while avoiding the EC or ECs mounted thereon. However, neither of the two manners can prevent the PCB from being vibrated.

The PCB may be vibrated because of, e.g., an impact produced when an EC is contacted with, and mounted on, the PCB, or an impact produced when the movement of the PCB in a direction parallel to the plane thereof is started or stopped. There arises no problem if the vibration disappears before the EC is actually mounted on the PCB. If not, the EC may be mounted at an inaccurate position on the PCB. That is, the accuracy of mounting of ECs is lowered.

Meanwhile, there is known an EC mounting system including a plurality of EC mounting heads which hold respective ECs; a first moving device which sequentially moves the EC mounting heads to a predetermined EC-mount position; a movable table which supports a PCB; and a second moving device which moves the movable table so that a plurality of predetermined EC-mount places on the PCB are sequentially positioned at a position, corresponding to the EC-mount position, where the EC mounting heads mount the respective ECs on the PCB. In this system, the starting and stopping of movement of the EC mounting heads or the PCB are repeated at a short cycle time and, before the vibration of the PCB due to one starting or stopping disappears, the next starting or stopping occurs. Thus, the vibration of the PCB is amplified, and the degree of inaccuracy of EC mounting is increased. This sort of EC mounting system is required to shorten its cycle time for the purpose of improving its EC-mounting efficiency. If the acceleration or deceleration of movement of the EC mounting heads or the PCB is increased to achieve this purpose, the vibration of the PCB will be further amplified.

In the case where no ECs are mounted on the supported surface of the PCB, the vibration of the PCB can be prevented by supporting the entire supported surface of the PCB with a member (e.g., sponge rubber) having a vibration damping ability. However, in the case where one or more ECs are mounted on the supported surface of the PCB, it is impossible to support the entire supported surface of the PCB. Accordingly, it cannot help using a plurality of iron pins for supporting respective small portions of the supported surface of the PCB while avoiding the EC or ECs mounted thereon. In this case, however, the vibration of the PCB cannot be effectively prevented. Moreover, since the EC or ECs mounted on the PCB behave as some mass, the vibration of the PCB is amplified to some degree, which leads to complicating the problem.

SUMMARY OF THE INVENTION

It is therefore an object of the present invention to provide a method of supporting a printed circuit board on the side of one surface thereof, with reduced vibration of the board.

It is another object of the present invention to provide a device for supporting a printed circuit board on the side of one surface thereof, with reduced vibration of the board.

It is another object of the present invention to provide a method of mounting electric components on a printed circuit board, with reduced vibration of the board.

It is another object of the present invention to provide a member for supporting a printed circuit board on the side of one surface thereof, with reduced vibration of the board.

It is another object of the present invention to provide a kit for providing a plurality of members each of which supports a printed circuit board on the side of one surface thereof, with reduced vibration of the board.

It is another object of the present invention to provide a material for providing a plurality of members each of which supports a printed circuit board on the side of one surface thereof, with reduced vibration of the board.

It is another object of the present invention to provide a method of producing a device for supporting a printed circuit board on the side of one surface thereof, with reduced vibration of the board.

It is another object of the present invention to provide a jig for producing a device for supporting a printed circuit board on the side of one surface thereof, with reduced vibration of the board.

The present invention provides a printed-circuit-board ("PCB") supporting method, a PCB supporting device, an electric-component mounting method, a PCB supporting member, a PCB-supporting-member providing kit, a PCB-supporting-member providing material, a PCB-supporting-device producing method, and a PCB-supporting-device producing jig which have one or more of the technical features are described below in respective paragraphs given parenthesized sequential numbers (1) to (30). Any technical feature which includes another technical feature shall do so by referring, at the beginning, to the parenthesized sequential number given that technical feature. Thus, two or more of the following features may be combined, if appropriate. Each feature may be accompanied by a supplemental explanation, as needed. However, the following features and the possible combinations thereof are just examples to which the present invention is by no means limited.

(1) According to a first feature of the present invention, there is provided a method of supporting a printed circuit board, comprising the step of causing a contact portion of at least one board supporting member including a vibration damping portion formed of a vibration damping rubber, to contact at least one portion of a lower surface of the printed circuit board and thereby support the printed circuit board on a side of the lower surface thereof. The printed circuit board ("PCB") is supported by the board supporting member including the vibration damping. portion. Therefore, even if the PCB may be vibrated when an electric component ("EC") is mounted on the PCB or when the movement of the PCB in a direction parallel to the plane of the PCB is started or stopped, the energy of the vibration is absorbed by the vibration damping portion or rubber and accordingly the vibration of the PCB is prevented. For example, even if a number of ECs are sequentially contacted with the PCB while the starting and stopping of movement of the PCB are repeated, the vibration of the PCB is effectively prevented and the ECs are accurately mounted on the PCB. In the case where ECs are temporarily fixed to the PCB with a creamed solder or an adhesive, the ECs are effectively prevented from being dislocated on the PCB. In the case where a dispenser applies an adhesive to the PCB, the vibration of the PCB is prevented and the adhesive can be applied in appropriate amount and shape to the PCB. In a particular case where the dispenser is provided with a stopper which contacts the PCB and thereby keeps a predetermined distance between the dispenser and the PCB, the stopper could not stably contact the PCB if the PCB would be vibrated. However, according to the present method, the vibration of the PCB is prevented, so that the stopper can stably contact the PCB. Since the predetermined distance is kept between the dispenser and the PCB, the adhesive can be applied in appropriate amount and shape to the PCB. Also in the case where the dispenser is provided with no stopper, the vibration of the PCB is prevented and accordingly a predetermined distance is kept between the dispenser and the PCB, so that the adhesive can be applied in appropriate amount and shape to the PCB. Meanwhile, the PCB supporting member contacts only a portion of the lower surface of the PCB. This portion can be selected such that the selected portion is free from the EC or ECs mounted on the lower surface or the creamed solder applied on the same. Thus, the PCB supporting member is prevented from interfering with the EC or ECs and/or the creamed solder on the lower surface of the PCB. The present method may employ either a single PCB supporting member, or a plurality of PCB supporting members. In the latter case, it is preferred that the plurality of PCB supporting members support a plurality of uniformly distributed portions of the lower surface of the PCB, respectively, and that the distance between each pair of adjacent portions of the PCB supported by a corresponding pair of PCB supporting members be as short as possible. That is, it is preferred that the lower surface of the PCB do not have any broad portions each of which is not supported by any PCB supporting members.

(2) According to a second feature of the present invention that includes the first feature (1), the vibration damping portion comprises the contact portion. The PCB supporting member may be entirely formed of the vibration damping rubber. However, this is not essentially required. In fact, the PCB supporting member which includes the vibration damping rubber as only a portion thereof can prevent the vibration of the PCB, and can be produced at low cost. The vibration damping portion comprising the contact portion can effectively prevent the vibration of the PCB, because the vibration damping portion directly contacts the PCB and directly absorbs the energy of the vibration.

(3) According to a third feature of the present invention that includes the first or second feature (1) or (2), the step of causing the contact portion of the at least one board supporting member comprises causing respective contact portions of a plurality of board supporting members each of which includes a vibration damping portion formed of a vibration damping rubber, to contact respective portions of the lower surface of the printed circuit board. The more the portions of the PCB that are supported by the PCB supporting members are, the more vibration of the PCB is prevented.

(4) According to a fourth feature of the present invention that includes the third feature (3), the step of causing the respective contact portions of the board supporting members comprises turning one of a plurality of printed circuit boards, upside down, such that a first surface thereof as a lower surface thereof to be contacted by the contact portions of the board supporting members faces upward, placing the board supporting members on the first surface of the one printed circuit board, such that the contact portions of the board supporting members are contacted with the portions of the first surface, respectively, placing at least one support plate on respective end surfaces of the board supporting members which surfaces are opposite to the respective contact portions thereof, in a state in which the support plate is positioned relative to the one printed circuit board, fixing the support plate and the end surfaces of the board supporting members to each other, thereby producing a printed-circuit-board supporting device, turning the printed-circuit-board supporting device upside down, and causing the board supporting members of the printed-circuit-board supporting device to sequentially support each of the printed circuit boards. The present method may be carried out in various cases, e.g., in the case where ECs are mounted on each of the PCBs, or in the case where a dispenser applies an adhesive to each of the PCBs. In these specific two cases, it is preferred to support each PCB while preventing the vibration thereof. The vibration of each PCB is prevented by the PCB supporting members each of which includes the vibration damping portion formed of the vibration damping rubber. The PCB supporting members are placed on respective supportable portions of the first surface of each PCB that can be supported by the supporting members, that is, are free from, e.g., the ECs mounted on the first surface or the adhesive applied to the same. The support plate is placed on, and fixed to, the PCB supporting members. Thus, the PCB supporting device for supporting the supportable portions of the first surface of each PCB is easily produced. After the PCB supporting device is produced, the device is turned upside down so that the PCB supporting members of the device support each of the PCBs. To this end, the PCB supporting device is positioned relative to each PCB in the same relationship as that in which the support plate is positioned relative to the placed PCB for producing the supporting device. Thus, the PCB supporting members of the supporting device are reliably contacted with the supportable portions of the first surface of each PCB that are free from, e.g., the ECs mounted on the first surface. That is, the PCB supporting members support each PCB without interfering the ECs mounted thereon. The dimension of each of the PCB supporting members as measured in a PCB-support direction perpendicular to the first surface of each PCB, can be selected such that a large space is defined between the respective end surfaces of the contact portions of the PCB supporting members that are contacted with the each PCB and a support surface of the support plate to which the supporting members are fixed, the large surface having a dimension greater than, e.g., the height of the tallest one of all the ECs mounted on the first surface of the each PCB. Thus, the PCB supporting device can support the each PCB, while preventing the support plate thereof from interfering with the ECs mounted on the PCB. In the case where a height-adjust plate is used as fixed to the support plate, different sorts of PCB supporting members having different lengths corresponding to different sorts of ECs having different heights, respectively, may be used in mixture for producing a PCB supporting device. In this case, the PCB supporting device defines a stepped space which allows the different sorts of supporting members to support each PCB, while preventing the support plate thereof from interfering with the different sorts of ECs mounted on the PCB. When the support plate is set and positioned relative to the PCB, the plurality of PCB supporting members are set and positioned relative to the PCB, all at once; and when the support plate is removed, all the PCB supporting members are removed at once. The present method may be carried out in the case where a creamed solder is screen-printed on each of the PCBs. In this case, only a member for screen-printing the creamed solder is moved relative to each PCB and a screen and accordingly the vibration of the each PCB is not serious. Accordingly, it is required that the PCB be supported with a high degree of flatness rather than with reduced vibration. Thus, it is preferred that at least one of the PCB supporting members include a rigid portion formed of a rigid material such as aluminum.

(5) According to a fifth feature of the present invention that includes the fourth feature (4), the step of fixing the support plate and the end surfaces of the board supporting members comprises fixing the support plate and the end surfaces of the board supporting members via respective tacky layers formed on the end surfaces. Each of the tacky layers includes a tacky material that is not hardened even if it is left exposed to the ambient air at room temperatures. Therefore, each tacky layer can be used repeatedly. Depending upon the material of the support plate, the PCB supporting members which have been once used with the support plate may be removed from the support plate and used again for producing another PCB supporting device.

(6) According to a sixth feature of the present invention that includes the fourth or fifth feature (4) or (5), the step of placing the board supporting members on the first surface of the placed printed circuit board comprises fitting a spacer member on an outer surface of the contact portion of at least one of the board supporting members, thereby preventing the contact portion of the one board supporting member from contacting an electric component mounted on the first surface. In view of the accuracy of positioning of each PCB and each of the PCB supporting members and the accuracy of mounting of each of the ECs, it is preferred that a space greater than a predetermined value (e.g., 1 mm) be provided between one or more ECs mounted on the first surface of each PCB and the contact portion of each PCB supporting member, so that the contact portion is prevented from contacting the ECs. The spacer member whose thickness is not smaller than the predetermined value may first be placed on a supportable portion of the first surface that is free from the ECs and then the contact portion of one PCB supporting member may be fitted in an inner space of the spacer member. Alternatively, the spacer member which is fitted in advance on the contact portion of one PCB supporting member may be placed with the contact portion on a supportable portion of the first surface that is free from the ECs. In either manner, subsequently, the one PCB supporting member is fixed to the support plate. Then, the spacer member is removed from the contact portion of the one supporting member. In the present method, the PCB supporting members can support each PCB without interfering with the ECs mounted on the PCB, even if the ECs have been mounted on the PCB with some positional errors. The spacer member has a shape corresponding to the profile of a transverse cross section of the contact portion of one PCB supporting member, taken along a plane perpendicular to the PCB-support direction of the supporting member. However, it is not essentially required that the spacer member be provided by an annular member. The spacer member may be provided by a member which is not continuous in a portion thereof. The spacer member is only required to have a shape which allows the spacer member to be fitted on the contact portion of one PCB supporting member.

(7) According to a seventh feature of the present invention, the r e is provided a printed-circuit-board PCB-supporting device for contacting a plurality of portions of a first one of opposite surfaces of a printed circuit board, and thereby supporting the printed circuit board on a side of the first surface, comprising at least one support plate; and a plurality of board supporting members which are fixed t o a plurality of portions of the support plate, respectively, each of the board supporting members including a vibration damping portion formed of a vibration damping rubber. The plurality of PCB supporting members support the plurality of supportable portions of the first surface of the PCB, respectively, while the respective vibration damping portions of the supporting members cooperate with each other to prevent the vibration of the PCB. Since a plurality of PCB supporting members are fixed to a plurality of portions of the support plate, respectively, those PCB supporting members can be set and reset relative to the PCB, all at once. Since the PCB supporting device is provided by the support plate and the plurality of PCB supporting members, the supporting device enjoys a simple construction and a low production cost.

(8) According to an eighth feature of the present invention that includes the seventh feature (7), the vibration damping portion of the each of the board supporting members comprises a contact portion which contacts a corresponding one of the plurality of portions of the first surface of the printed circuit board. Since the vibration contact portion directly contacts the PCB, the each PCB supporting member can effectively prevent the vibration of the PCB.

(9) According to a ninth feature of the present invention that includes the seventh or eighth feature (7) or (8), the support plate comprises at least one reference portion for being positioned relative to the printed circuit board. When the PCB supporting members are attached to the support plate, or when the support plate to which the supporting members have been attached is attached to a PCB positioning and supporting device, the reference portion of the support plate is used as a reference for positioning the support plate relative to the PCB.

(10) According to a tenth feature of the present invention, there is provided a method of mounting a plurality of electric components, comprising the steps of causing a movable table which is movable to an arbitrary position on a substantially horizontal plane, to support a lower surface of a printed circuit board via at least one board supporting member including a vibration damping portion formed of a vibration damping rubber, and causing a plurality of mounting heads to hold the plurality of electric components, respectively, and moving the plurality of mounting heads to sequentially reach a predetermined component-mount position where the plurality of mounting heads sequentially mount the plurality of electric components at a plurality of component-mount places, respectively, on an upper surface of the printed circuit board supported by the movable table via the board supporting member, while the printed circuit board is moved with the movable table. The present EC mounting method may be carried out by an EC mounting apparatus which includes an intermittent-rotation body which is intermittently rotatable about an axis line at an intermittent-rotation angular pitch; a plurality of EC mounting heads which are provided on the intermittent-rotation body such that the EC mounting heads are equiangularly spaced from each other at a spacing angular pitch equal to the intermittent-rotation angular; and an intermittently rotating device which intermittently rotates the intermittent-rotation body about the axis line, so that the EC mounting heads are sequentially moved to each of a plurality of operation positions such as an EC-pick-up position and an EC-mount position. The present method may also be carried out by an apparatus disclosed in Japanese Patent Application laid open for public inspection under Publication No. 9-237997, corresponding to U.S. Pat. application Ser. No. 8-769,700 now U.S. Pat. No. 5,926,950. This apparatus includes a plurality of rotary members which are rotatable about a common axis, independent of each other; a rotary-motion applying device which applies, to each of the rotary members, such a rotary motion that the each rotary member is rotated 360 degrees about the common axis line, during the 360-degree rotation the each rotary member is stopped at least one time, and the each rotary member has a predetermined time difference from each of its preceding and following rotary members; and a plurality of EC mounting heads which are supported by the plurality of rotary members, respectively, and which can hold respective ECs. Moreover, the present method may be carried out by an apparatus which includes a rotatable body which is rotatable about an axis line; a plurality of EC mounting heads which are provided on the rotatable body; and a rotating device which rotates the rotatable body by arbitrary angles, so that the EC mounting heads are sequentially moved to an EC-mount position. In each of the three apparatuses, the plurality of EC mounting heads are moved to the EC-mount position at a short time interval, that is, a short cycle time, so that the EC mounting heads mount respective ECs on a PCB. Furthermore, the present method may be carried out by an apparatus which includes a movable table which supports a PCB and which is movable in one of two directions perpendicular to each other on a plane; a plurality of EC mounting heads which hold respective ECs; and a head moving device which moves the EC holding heads in the other direction. While the EC holding heads are sequentially moved to the EC-mount position, the PCB is moved so that predetermined EC-mount places on the PCB are sequentially moved to a position corresponding to the EC-mount position. Thus, at the EC-mount position, the EC holding heads sequentially mount the respective ECs on the PCB, at a short cycle time. Therefore, if the vibration of the PCB would not be effectively prevented, the mounting of the current EC on the PCB would occur before the vibration of the PCB disappears which is produced when the prior EC is contacted with, and mounted on, the PCB, when the EC holding head releases the prior EC and is moved away from the same, or when the PCB is moved for the current EC to be mounted thereon. This leads to lowering the accuracy of mounting of ECs. This problem will be more serious in the case where the cycle time of EC mounting is shortened to improve the efficiency of EC mounting. In the present method, since the PCB supporting member including the vibration damping portion supports the PCB, the vibration damping portion absorbs the energy of the vibration exerted to the PCB, thereby preventing the vibration of the PCB. Therefore, it is not needed to reduce the acceleration and/or deceleration of movement of the movable portions (the heads, the table, etc.), for the purpose of preventing the vibration of the PCB. This leads to improving the efficiency of EC mounting. In the case where the EC mounting efficiency may not be improved, the accuracy of EC mounting may be improved. The supplying of ECs to the EC mounting heads may be carried out in such a manner that a plurality of EC feeders are provided on a movable table such that respective EC-supply portions thereof are arranged along a single line and, when the movable table is moved, the respective EC-supply portions are sequentially moved to an EC-supply position right below one EC mounting head being positioned at the EC-pick-up position. In this case, a PCB is vibrated when the movement of the movable table is started and stopped. This vibration of the PCB is effectively prevented by the PCB supporting member, so that the ECs are accurately mounted on the PCB.

(11) According to an eleventh feature of the present invention, there is provided a printed-circuit-board supporting member for contacting a portion of a first one of opposite surfaces of a printed circuit board, and thereby supporting the printed circuit board on a side of the first surface, comprising a vibration damping portion formed of a vibration damping rubber; and a fixing device which fixes one end of the printed-circuit-board supporting member to a support plate, the fixing device being provided at the one end of the supporting member, the vibration damping portion providing a complete transverse portion between the one end of the supporting member and a contact end of the supporting member which end contacts the portion of the first surface of the printed circuit board. The complete transverse portion which consists of the vibration damping rubber only completely occupies a portion of the PCB supporting member along a flat or curved surface intersecting the PCB-support direction of the supporting member. Therefore, the vibration transmitted from the PCB to the contact end of the PCB supporting member must pass, at least one time, through the complete transverse portion, before the vibration reaches the fixing device. It can be said that the PCB supporting member can be cut into two separate portions at the above-indicated flat or curved surface, or alternatively it can be said that any vibration-transmission route between the contact end of the PCB supporting member and the fixing device must pass, at least one time, through the vibration damping rubber. In the present PCB supporting member, the vibration damping rubber reliably absorbs the energy of the vibration exerted to the PCB.

(12) According to a twelfth feature of the present invention that includes the eleventh feature (11), the fixing device comprises a tacky layer formed on an end surface of the one end.

(13) According to a thirteenth feature of the present invention that includes the eleventh feature (11), the fixing device comprises a permanent magnet provided at the one end.

(14) According to a fourteenth feature of the present invention that includes any one of the eleventh to thirteenth features (11) to (13), the vibration damping portion has the contact end which contacts the portion of the first surface of the printed circuit board, and wherein the printed-circuit-board supporting member further comprises a secondary portion which supports the vibration damping portion. The vibration damping portion which directly contacts the first surface of the PCB can effectively prevent the vibration of the PCB. The PCB supporting member including the secondary portion can be produced at a lower cost than a PCB supporting member which is entirely formed of the vibration damping rubber. For example, in the case where one or more tall ECs are mounted on the first surface of the PCB, it is needed to use one or more long PCB supporting members. If the long supporting members are ones which are entirely formed of the vibration damping rubber, they cost high. In contrast, the present PCB supporting member includes the secondary portion which may be formed of a material cheaper than the vibration damping rubber. Thus, one or more long PCB supporting members can be produced at low cost. Meanwhile, when a PCB supporting device including at least one support plate and at least one PCB supporting member supports a PCB, the support plate may be positioned, in a PCB-support direction of the device, at a position which is appropriate for one or more long PCB supporting members to support a PCB on which one or more tall ECs are mounted. In this case, if one or more short PCB supporting members are attached to one or more support plates for producing a PCB supporting device, the short PCB supporting members on the support plates being positioned at the above-indicated appropriate position, however, cannot reach the PCB. The secondary portion of the present PCB supporting member may compensate for the shortage of each of the short PCB supporting members. In this case, each of different sorts of PCB supporting devices for supporting different sorts of PCBS, respectively, can be produced by using one or more support plates positioned at the above-indicated appropriate position unchanged.

(15) According to a fifteenth feature of the present invention that includes the fourteenth feature (14), the secondary portion is formed of a foamed material. The foamed material may be a urethane rubber or a sponge rubber. The foamed material is light, cheap, and is not elastically deformed so largely due to a small mass of a PCB and/or a small contact load at which each mounting head holding an EC contacts the PCB to mount the EC thereon.

(16) According to a sixteenth feature of the present invention that includes any one of the eleventh to fifteenth features (11) to (15), the printed-circuit-board supporting member further comprises a support pin which projects from an end surface of the printed-circuit-board supporting member which surface is opposite to the one end, the support pin having the contact end. One or more PCB supporting members each of which includes a support pin can support the first surface of the PCB on which the ECs are mounted at a high density or only small spaces are left among the mounted ECs (or the applied adhesive or the applied creamed solder).

(17) According to a seventeenth feature of the present invention that includes any one of the eleventh to fifteenth features (11) to (15), the printed-circuit-board supporting member further comprises a contact portion which includes the contact end and which is opposite to the one end, the contact portion having at least one recess so that a profile of a transverse cross section of the contact portion includes at least one inwardly deformed portion corresponding to the at least one recess. The shape, dimensions, and/or number of one or more recesses of the PCB supporting member may be predetermined, depending upon the shape, dimensions, and/or number of one or more ECs mounted on the first surface of the PCB, so that the PCB supporting member can support a supportable portion of the first surface of the PCB which portion is free from the ECs. In this case, the PCB supporting member does not interfere with the ECs. In addition, if a number of PCB supporting members are used, the total area of the respective contact portions of the PCB supporting members will be large, which leads to preventing more effectively the vibration of the PCB. The recess or recesses is or are not limited to one or ones which has or have a surface intersecting the PCB-support direction of the PCB supporting member, but may be a groove or grooves which extends or extend through the PCB supporting member in its PCB-support direction. In the case where one or more members other than the EC or ECs, such as the applied adhesive or the applied creamed solder is or are mounted on the first surface of the PCB, the PCB supporting member including one or more recesses may be used to support the PCB without interfering with the member or members.

(18) According to an eighteenth feature of the present invention that includes any one of the eleventh to seventeenth features (11) to (17), the printed-circuit-board supporting member further comprises a head portion having the contact end; a base portion which supports the head portion and includes the fixing device and which is provided separately from the head portion; and a connecting device which connects the head portion and the base portion to each other such that the head portion and the base portion are separable from each other. According to this feature, a plurality of sorts of head portions may be prepared and each of the head portions may be used with the common base portion. When the current sort of PCBs are changed to a different sort of PCBs, the current sort of PCB supporting member or members-may be changed to a different sort of PCB supporting member or members corresponding to the different sort of PCBs. In this case, the head portion or portions of the current PCB supporting member or members is or are removed from the base portion or portions, and replaced with a different sort of head portion or portions corresponding to the different sort of PCB supporting member or members. This manner costs lower than the manner in which the current sort of PCB supporting member or members is or are entirely replaced with the different sort of PCB supporting member or members.

(19) According to a nineteenth feature of the present invention, there is provided a kit comprising a plurality of printed-circuit-board supporting members each according to any one of the eleventh to eighteenth features (11) to (18); and a common base member to which each of the printed-circuit-board supporting members is detachably attached via the fixing device thereof. A material for providing the common base member may be selected depending upon the fixing devices of the PCB supporting members. For example, the common base member is formed of a peelable sheet or a magnet. Since the fixing device with which each PCB supporting member is fixed to the support plate is utilized to attach the each PCB supporting member to the common base member, the kit may be produced, in many cases, at lower cost than a kit wherein an exclusive fixing device is employed to attach each of a plurality of PCB supporting members to a common base sheet.

(20) According to a twentieth feature of the present invention that includes the nineteenth feature (19), the plurality of printed-circuit-board supporting members include respective contact portions which are opposite to the respective one ends thereof, which contact respective portions of the first surface of the printed circuit board, and which have an identical shape and an identical dimension. In the case where a desired PCB supporting device can be produced using only one sort of PCB supporting members whose respective contact portions have an identical shape and an identical dimension, the preparation of only one sort of kit or kits suffices. On the other hand, in the case where a desired PCB supporting device cannot be produced without using different sorts of PCB supporting members which are different from each other with respect to at least one of shape and dimension of the respective contact portions thereof, different sorts of kits are prepared, and the different sorts of PCB supporting members are removed in respective needed numbers from the different sorts of kits, and are used for producing the desired PCB supporting device. The number of each sort of kits to be prepared can be predetermined based on the frequency of use of the corresponding sort of PCB supporting members for producing a needed number of PCB supporting devices. Thus, the number of each sort of PCB supporting members that are left without being used can be minimized, which leads to reducing the production cost of the PCB supporting devices. In the case where the PCB supporting members provided by the kit include respective secondary portions in addition to the respective contact portions, those secondary portions may, or may not, have an identical shape and an identical dimension.

(21) According to a twenty-first feature of the present invention that includes the nineteenth feature (19), the plurality of printed-circuit-board supporting members include respective contact portions which are opposite to the respective one ends thereof and which contact respective portions of the first surface of the printed circuit board, the plurality of printed-circuit-board supporting members comprising a plurality of sorts of printed-circuit-board supporting members including respective contact portions which are different from each other in at least one of shape and dimension. According to this feature, a single kit provides a plurality of sorts of PCB supporting members. This kit is advantageously used for producing a PCB supporting device which needs two or more sorts of PCB supporting member comprising the plurality of sorts of PCB supporting members provided by the single kit.

(22) According to a twenty-second feature of the present invention that includes any one of the nineteenth to twenty-first feature (19) to (21), the fixing device of each of the printed-circuit-board supporting members comprises a tacky layer formed on an end surface of the one end thereof, and the common base member exhibits a lower degree of tackiness to the tacky layer than the end surface. According to this feature, each of the PCB supporting members can be easily removed from the common base member, in the state in which the each PCB supporting member keeping its tacky layer on its one end surface, so that the each PCB supporting can be fixed to the support member owing to its tacky layer.

(23) According to a twenty-third feature of the present invention that includes any one of the nineteenth to twenty-second feature (19) to (22), the kit further comprising a fitable member which is detachably fitable on an outer surface of a contact portion of at least one of the printed-circuit-board supporting members, so as to increase an apparent cross-section area of the contact portion, when the contact portion of the one supporting member is contacted with a portion of the first surface of the printed circuit board so as to produce a printed-circuit-board supporting device. The fitable member may be a spacer member which is used for securing a clearance between the contact portion of the PCB supporting member and one or more ECs mounted on the first surface of the PCB; or a supporter member for supporting the contact portion of the PCB supporting member that has only a small cross-section area, so that the PCB supporting member can stably stand on the first surface of the PCB.

(24) According to a twenty-fourth feature of the present invention, there is provided a material for providing a plurality of printed-circuit-board supporting members which contact respective portions of a first one of opposite surfaces of a printed circuit board and thereby supports the printed circuit board on a side of the first surface, the material having an elongate shape, the material comprising a vibration damping portion which is located in vicinity of one of opposite side surfaces of the material which extend in a longitudinal direction of the material, the vibration damping portion being formed of a vibration damping rubber; a tacky layer which is located adjacent to the other side surface; and a peelable sheet which covers the tacky layer such that the peelable sheet is peelable from the tacky layer, the material being cutable by a cutter along a plane intersecting the longitudinal direction, into a plurality of pieces which provide the plurality of printed-circuit-board supporting members, respectively. A desired length of the elongate material can be cut off based on the shape and area of any supportable portion of the first surface of the PCB which portion is free from the ECs, the adhesive, or the creamed solder. Thus, the present material can provide a PCB supporting member which has a desired contact or support area corresponding to a desired length and which supports the supportable portion of the first surface via the desired support area. However, the elongate material may be used as it is, without being cut, in the case where the material is used for supporting a large supportable portion of the first surface of the PCB which portion has a large area corresponding to the entire support area of the elongate material.

(25) According to a twenty-fifth feature of the present invention that includes the twenty-fourth feature (24), the material further comprises a secondary layer which is located between the vibration damping portion and the tacky layer and which is formed of a material different from the vibration damping rubber.

(26) According to a twenty-sixth feature of the present invention that includes the twenty-fifth feature (25), the secondary layer is formed of a foamed material.

(27) According to a twenty-seventh feature of the present invention that includes the twenty-fourth feature (24), the cutter is manually operated by an operator.

(28) According to a twenty-eighth feature of the present invention, there is provided a method of producing a printed-circuit-board supporting device which contacts at least one portion of a first one of opposite surfaces of a printed circuit board and thereby supports the printed circuit board on a side of the first surface, the method comprising the steps of placing the printed circuit board such that an upper surface of the placed printed circuit board is defined by the first surface thereof, placing at least one board supporting member on the first surface of the printed circuit board, such that a contact portion of the board supporting member is contacted with the portion of the first surface, placing a support plate on an end surface of the board supporting members which surface is opposite to the contact portion thereof, in a state in which the support plate is positioned relative to the printed circuit board, and fixing the support plate and the end surface of the board supporting member to each other, thereby producing the printed-circuit-board supporting device. The PCB supporting member may be provided, depending upon the goal of use thereof, by one which includes a vibration damping portion and which not only supports the PCB but also damps the vibration of the same; or one which includes no vibration damping portion and whose contact portion is formed of a rigid material such as aluminum. According to this feature, one or more PCB supporting members are placed on one or more supportable portions of the first surface of the PCB that are free from the ECs, the adhesive, or the creamed solder, and one or more support plates are placed on, and fixed to, the respective end surfaces of the PCB supporting members. In this way, a PCB supporting device is easily produced which can support the supportable portions of the first surface of the PCB.

(29) According to a twenty-ninth feature of the present invention, there is provided a jig for producing a printed-circuit-board supporting device which contacts a plurality of portions of a first one of opposite surfaces of a printed circuit board and thereby supports the printed circuit board on a side of the first surface, the printed-circuit-board supporting device including a support plate and a plurality of board supporting members fixed to the support plate, the jig comprising a board holding member which contacts a second one of the opposite surfaces of the printed circuit board and thereby holds the printed circuit board; a first positioning device which positions the printed circuit board relative to the board holding member in a direction parallel to a plane of the printed circuit board; and a second positioning device which positions the support plate relative to the board holding member in a direction parallel to a plane of the support plate and which permits the positioned support plate to be moved toward the printed circuit board. The first positioning device positions the PCB relative to the board holding member, and the second positioning device positions the support plate relative to the same, i.e., the board holding member. Thus, the support plate is positioned relative to the PCB in a direction parallel to the respective planes of the support plate and the PCB. In this state, the second positioning device permits the thus positioned support plate to be moved toward the PCB in a direction perpendicular to the plane of the PCB. In short, the support plate is movable toward the PCB, in the state in which the support plate is positioned relative to the PCB. According to this feature, one or more PCB supporting members is or are placed on one or more supportable portions of the first surface of the PCB held by the board holding member, in such a manner that respective one ends of the PCB supporting members are contacted with the supportable portions of the first surface, and, in this state, one or more support plates is or are moved toward the PCB till the support plates contact the respective other ends of the PCB supporting members. Then, the support plates are fixed to the other ends of the PCB supporting members, so as to produce a PCB supporting device wherein the PCB supporting members are fixed to appropriate portions of the support plates. The present jig enjoys a simple construction, because it is provided by the board holding member and the first and second positioning devices. With this jig, a user can easily produce a PCB supporting device wherein one or more PCB supporting members is or are fixed to one or more desired positions on one or more support plates. The user can more easily produce a PCB supporting device, if he or she uses, in combination with the present jig, the kit according to any one of the nineteenth to twenty-third features (19) to (23).

(30) According to a thirtieth feature of the present invention that includes the twenty-ninth feature (29), the jig further comprises an indicating device which indicates, to an operator, an inhibiting area on the printed circuit board held by the board holding member, an operator being inhibited from placing each of the board supporting members in the inhibiting area on the printed circuit board. The first surface of the PCB may include one or more inhibiting portions or areas which must not be supported by any PCB supporting members. For example, the inhibiting portions or areas may be portions with which one or more PCB positioning members are engaged, or portions which are supported by a PCB conveyor device such as one or more conveyor belts or chains. Since the indicating device indicates, to the operator, the inhibiting area or areas on the first surface of the PCB, he or she can recognize one or more supportable portions of the first surface of the PCB which can be supported by one or more PCB supporting members. Therefore, the PCB supporting device produced using the present jig can support the PCB, while the PCB supporting members of the device are reliably prevented from interfering with the PCB positioning members, the conveyor belts or chains, or the like.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Figure 1:
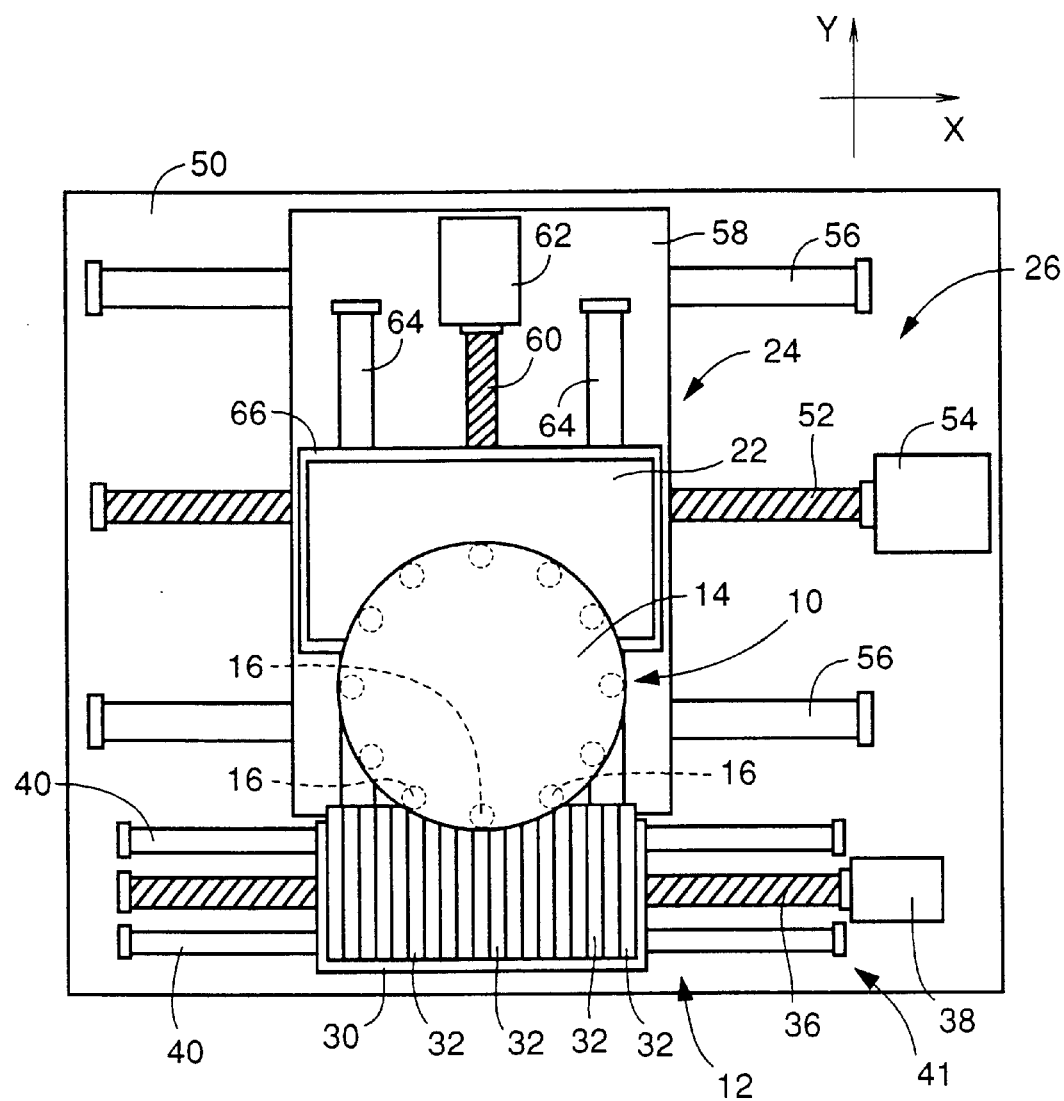
FIG. 1 is a schematic plan view of an electric-component ("EC") mounting system which performs a printed-circuit-board ("PCB") supporting method and an EC mounting method to which the present invention is applied.

Hereinafter, there will be described an electric-component ("EC") mounting system to which the present invention is applied.

The EC mounting system includes an EC mounting device 10, and an EC supplying device 12. The EC mounting device 10 includes an index table 14 which is intermittently rotatable about a vertical axis line. The index table 14 as a sort of EC mounting head has twelve EC suction heads 16 each of which sucks and holds an EC 146 (FIG. 7) by applying a negative air pressure thereto. The index table 14 supports the twelve EC suction heads 16 such that the suction heads 16 are equiangularly spaced from one another about the vertical axis line. The index table 14 is intermittently rotated by an intermittently rotating device (not shown) including a cam, a cam follower, an axis member, and an indexing servomotor which rotates the cam. As the index table 14 is intermittently rotated, the twelve EC suction heads 16 are sequentially moved to each of a plurality of operation positions including an EC-suck position (i.e., an EC-pick-up position), an EC-posture-detect position, an EC-posture-correct position, and an EC-mount position. At the EC-mount position, each of the EC suction heads 16 mounts an EC 16 on a printed circuit board ("PCB") 22. The EC supplying device 12 includes a plurality of EC feeders 32 each of which is detachably attached to a feeder-support table 30. The EC feeders 32 are supported on the support table 30 such that respective EC-supply portions of the feeders 32 are arranged along a straight line on a horizontal plane (hereinafter, a direction parallel to this straight line is referred to as the "X direction"). As a ball screw 36 is rotated by an X-axis servomotor 38, the feeder-support table 30 is moved in the X direction while being guided by a pair of guide rails 40. Thus, the EC-supply portion of an appropriate one of the EC feeders 32 is moved to an EC-supply position. The ball screw 32 and the X-axis servomotor 38 cooperate with each other to provide a table moving device 41. In the present embodiment, each of the EC feeders 32 includes a tape feeding device as a sort of EC feeding device, and a tape-reel holding device as a sort of EC storing device, and supplies a plurality of ECs 146 in the form of an EC carrier tape. The tape feeding device and the tape-reel holding device are provided on a common main frame of the each EC feeder 32.

Figure 2:
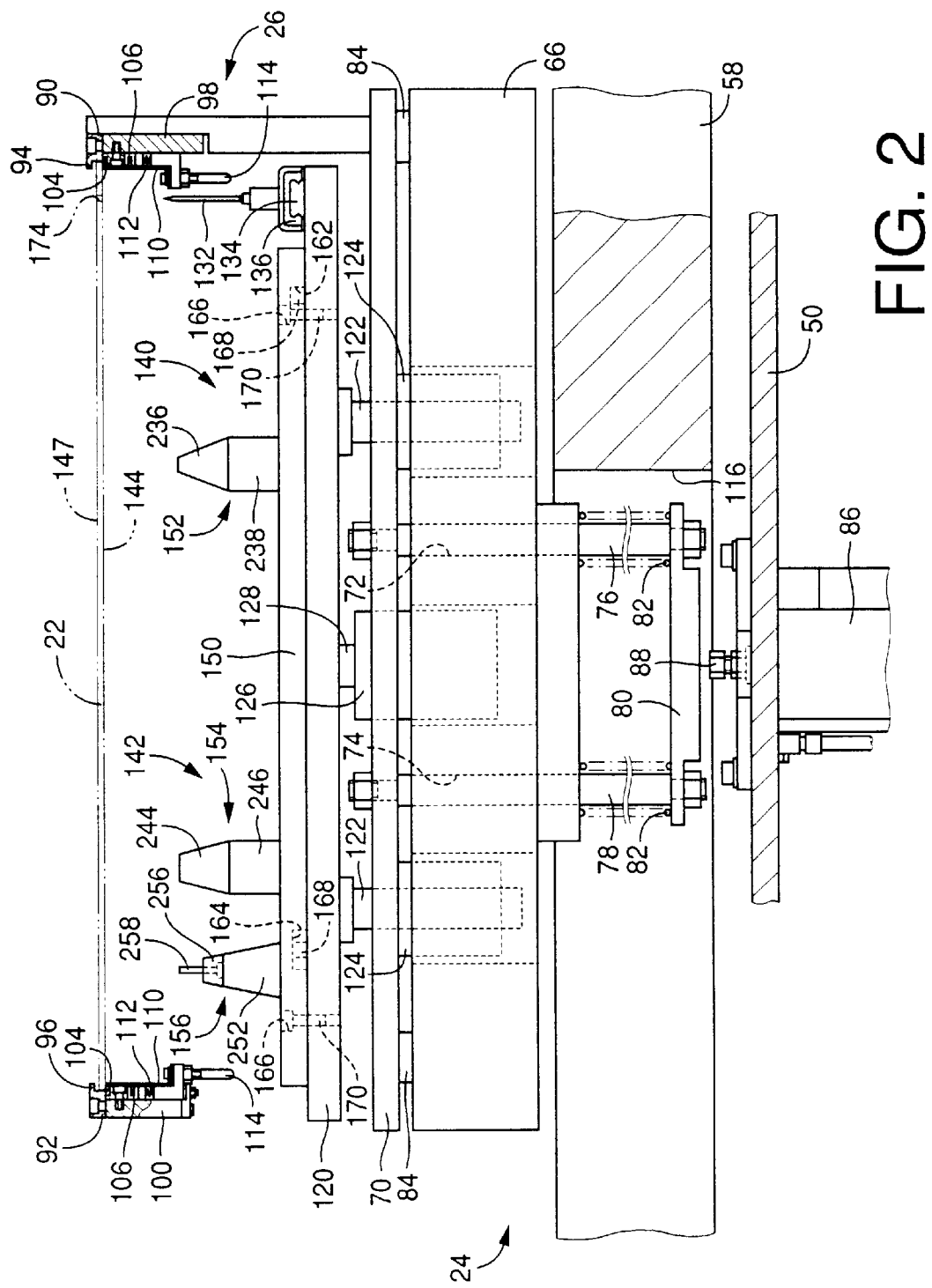
FIG. 2 is a partly cross-sectioned, side elevation view of a PCB positioning and supporting ("P-S") device of the EC mounting system of FIG. 1.

The PCB 22 is supported by a PCB positioning and supporting ("P-S") device 26 including an X-Y table 24, and is moved to an arbitrary position on an X-Y plane by the same 26. The PCB P-S device 26, which is disposed with the EC mounting device 10 and the EC supplying device 12 on a common base 50, receives a PCB 22 from a PCB carry-in device (not shown) and discharges the PCB 22 to a PCB carry-out device (not shown). The PCB carry-in and carry-out devices includes respective pairs of conveyor belts each pair of which convey the PCB 22 in the X direction. As shown in FIGS. 1 and 2, as a ball screw 52 provided on the base 50 is rotated by an X-axis servomotor 54, an X table 58 of the X-Y table 24 is moved in the X direction while being guided by a pair of guide rails 56 and, as a ball screw 60 provided on the X table 58 is rotated by a Y-axis servomotor 62, a Y table 66 of the X-Y table 24 is moved in a Y direction perpendicular to the X direction while being guided by a pair of guide rails 64. Each of the servomotors 38, 54, 62 is a sort of electric motor as a drive source, and is an electric rotary motor which is precisely controllable with respect to its rotation angle or amount. The servomotors 38, 54, 62 may be replaced with stepper motors, and the electric rotary motors 38, 54, 62 may be replaced with linear motors.

As shown in FIG. 2, on the Y table 66, there is provided a first elevator table 70 such that the first table 70 is immovable in the X and Y directions relative to the Y table 66 and is movable in a vertical direction, i.e., a Z direction perpendicular to the X and Y directions relative to the Y table 66. The Y table 66 has a pair of through-holes 72, 74 which are formed through the thickness thereof in the Z direction, and a pair of rods 76, 78 extend through the pair of through-holes 72, 74, respectively, such that each of the rods 76, 78 is movable in an axial direction relative to a corresponding one of the holes 76, 78. The first table 70 is fixed to respective upper end portions of the two rods 76, 78 that project upward from the Y table 66.

Respective lower end portions of the two rods 76, 78 that project downward from the Y table 66 are connected to a connection bar 80. Two compression coil springs 82 each as an elastic member as a sort of biasing device are fitted on the respective lower end portions of the two rods 76, 78 that project downward from the Y table 66. Respective lower ends of the two springs 82 are seated on the connection bar 80. Owing to respective biasing forces of the two springs 82, the first table 70 is kept at its lower movement end position where the first table 70 contacts stoppers 84 provided on the Y table 66. On the base 50, there is provided an air cylinder 86 as a sort of fluid-pressure-operated cylinder device as a drive source. The connection bar 80 is lifted up by an adjustable bolt 88 fixed to a piston rod of the air cylinder 86, so that the first table 70 is moved to its upper movement end position where the first table 70 is apart a predetermined distance upward from the Y table 66.

On the first table 70, there are provided a fixed guide 90 and a movable guide 92. Each of the fixed and movable guides 90, 92 has an elongate shape having a rectangular cross section. The two guides 90, 92 include respective hold-down portions 94, 96 projecting from respective upper end portions thereof. The fixed guide 90 is fixed to a plate-like support member 98 such that the fixed guide 90 extends parallel to the X direction. The support member 98 is fixed to one of two sides of the first table 70 that are parallel to the X direction, such that the support member 90 extends parallel to the X direction. The movable guide 90 is fixed to another support member 100. Two slide members (not shown) are fitted in respective grooves which are formed in an upper surface of the first table 70, apart from each other in the X direction, so that the two slide members are movable in the Y direction. Lengthwise opposite end portions of the support member 100 are fixed to respective upper end portions of the two slide members, so that the support member 100 extends parallel to the X direction and accordingly the movable guide 92 extends parallel to the X direction. Owing to the movement of the slide members, the movable guide 92 is moved toward, and away from, the fixed guide 90. Thus, a PCB-guide width of the PCB P-S device 26 (i.e., a distance between the fixed and movable guides 90, 92) can be adjusted depending upon the size of the PCB 22.

Two belt guides 104 are fixed, below the two hold-down portions 94, 96, to respective upper end portions of respective inner surfaces of the two support members 98, 100 which surfaces are opposed to each other. Two endless conveyor belts 106 are wound on the two belt guides 104, respectively. The two conveyor belts 106 are driven or circulated in synchronism with each other by a belt drive device (not shown) including a belt drive motor as a drive source. Two projecting members 110 are fitted in the two support members 98, 100, respectively, such that each of the projecting members 110 is movable upward and downward. Each of the two projecting members 110 has a plate-like shape, is elongate in the X direction, is located inside a corresponding one of the two conveyor belts 106, and is biased downward by a spring 112. The end of downward movement of each projecting member 110 by the biasing force of the corresponding spring 112, is defined by a stopper (not shown). In the state in which the two projecting members 110 are kept at their lower movement end position, respective upper ends of the projecting members 110 are substantially level with respective upper flat portions of the two endless conveyor belts 106. Two engaging pins 114 are fixed to opposite ends of each projecting member 110, respectively, that are distant from each other in the X direction, such that each of the engaging pins 114 extends downward.

In the state in which the first table 70 is kept at its lower movement end position as shown in FIG. 2, the first table 70 and the PCB 22 placed on the first table 70 are positioned below the PCB carry-in and carry-out devices, and are moved with the Y table 66 in the X and Y directions without being interfered with by the carry-in and carry-out devices. The X table 58 has an opening 116 which extends in the Y direction and which permits the rods 76, 78 projecting downward from the Y table 66, and the connection bar 80, to be moved with the Y table 66 in the Y direction.

In the state in which the first table 70 is kept at its origin position where the first table 70 is aligned with the PCB carry-in and carry-out devices in the Y direction, is positioned between the carry-in and carry-out devices in the X direction, and is kept at its upper movement end position by the air cylinder 86, the height position of respective PCB-convey surfaces of the two conveyor belts 106 that are defined by respective upper surfaces of the respective upper flat portions of the two belts 106 is the same as the height position of respective PCB-convey surfaces of two conveyor belts of the PCB carry-in device that are defined by respective upper surfaces of respective upper flat portions of the two belts, and the height position of respective PCB-convey surfaces of two conveyor belts of the PCB carry-out device that are defined by respective upper surfaces of respective upper flat portions of the two belts. At the origin position, the first table 70 receives a PCB 22 from the PCB carry-in device and discharges the PCB 22 to the PCB carry-out device.

On the first elevator table 70, there is provided a second elevator table 120 such that the second table 120 can be elevated and lowered. The second table 120 has a plate-like shape, and a pair of guide rods 122 as guide members are fixed to a lower surface of the second table 120. The two guide rods 122 are fitted in respective guide bushings 124 fixed to a lower surface of the first table 70, such that each of the guide rods 122 is movable in its axial direction relative to a corresponding one of the guide bushings 124.

The guide bushings 124 are fitted in respective holes formed through the thickness of the Y table 66, such that each of the bushings 124 is movable upward and downward. A piston rod 128 of an air cylinder 126 as a sort of fluid-pressure-operated actuator as a drive source, and as a sort of fluid-pressure-operated cylinder device, is fixed to the lower surface of the second table 120. The air cylinder 126 is fixed to the first table 70 such that the air cylinder 126 extends in a vertical direction, and is fitted in a hole formed through the thickness of the Y table 66, such that the air cylinder 126 is movable upward and downward relative to the Y table 66. The air cylinder 126 is of a single action type. Therefore, when the piston rod 128 is extended out by a biasing force of a spring (not shown) provided in the housing, the second table 120 is moved upward relative to the first table 70; and, when compressed air is supplied to an air chamber (not shown) and the piston rod 128 is retracted into the housing, the second table 120 is moved downward relative to the first table 70. A lower movement end position of the second table 120 is defined by a stroke end of a piston (not shown) of the air cylinder 126.

As shown in FIG. 2, on the second table 120, there are provided a main PCB positioning pin (not shown) and a secondary PCB positioning pin 132 which cooperate with each other to position the PCB 22 on a horizontal plane. The main and secondary positioning pins 132 are provided on the side of the fixed guide 90. The main pin is fixed to the second table 120, and the secondary pin 132 is provided on the second table 120 such that the secondary pin 132 is movable in the X direction. A guide rail 134 is fixed to the second table 120 such that the guide rail 134 extends in the X direction, and a block member 136 is fitted on the guide rail 134 such that the block member 136 is movable in the X direction. The secondary pin 132 is fixed to the block member 136, so that the secondary pin 132 is movable toward, and away from, the main pin. The position of the secondary pin 132 is adjustable depending upon the size of the PCB 22.

Figure 3:
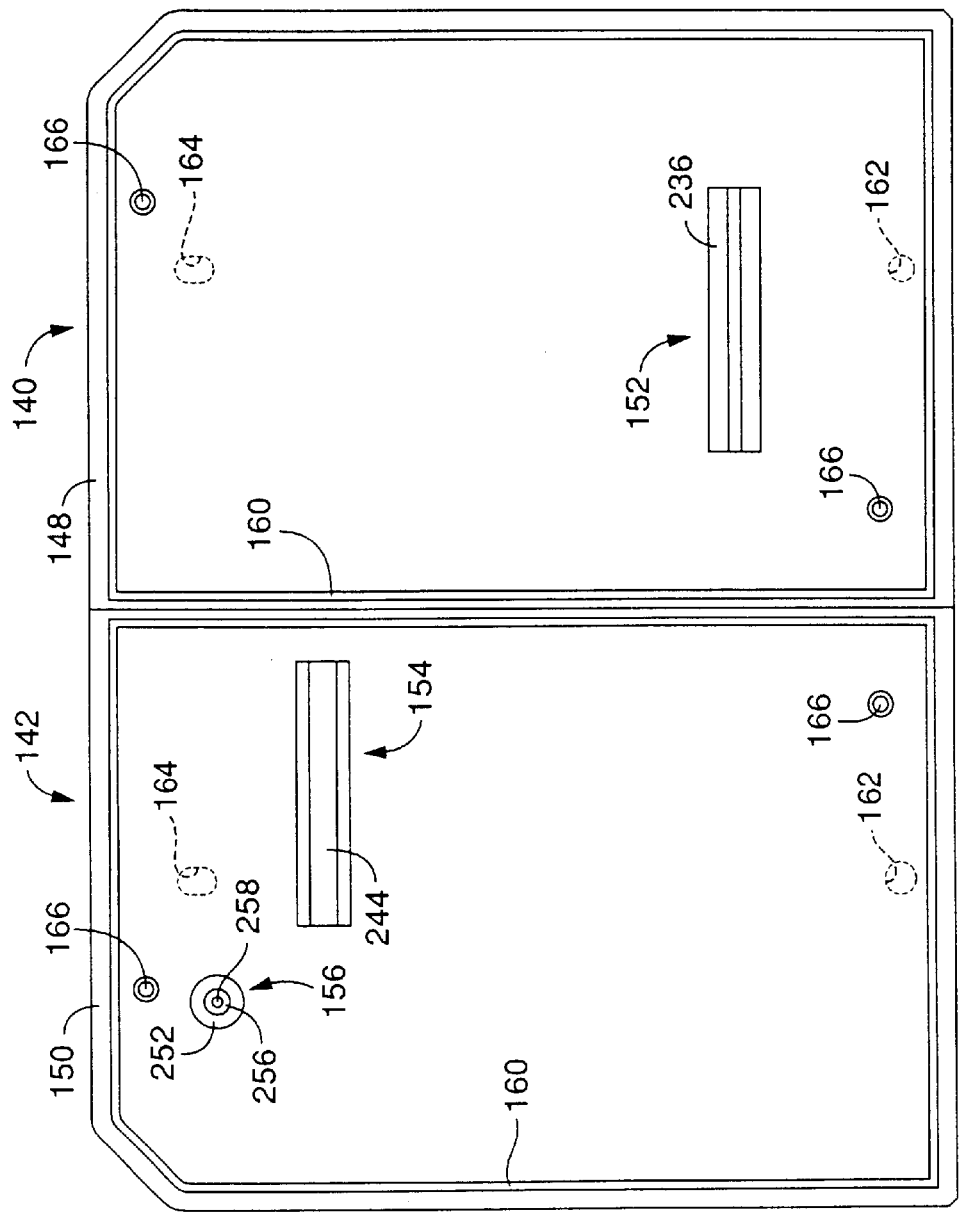
FIG. 3 is a plan view of PCB supporting devices of the PCB P-S device of FIG. 2.

On the second table 120, two PCB supporting devices 140, 142 are provided. The two PCB supporting devices 140, 142 support a PCB 22 under a lower surface thereof. Electric components ("ECs") 146 (FIG. 7) have already been mounted on a first surface 144 of the PCB 22 that provides, after the PCB 22 is turned upside down, the lower surface of the PCB 22 that is supported by the supporting devices 140, 142. Hereinafter, the other surface of the PCB 22 that is opposite to the first surface 144 will 40 be referred to as a second surface 147 (FIG. 2). The second surface 147 is an upper surface on which ECs 146 will be mounted. As shown in FIG. 3, the first PCB supporting device 140 includes a support plate 148, and a PCB supporting member 152 fixed to one surface of the support plate 148, and the second PCB supporting device 142 includes a support plate 150, and two PCB supporting members 154, 156 fixed to one surface of the support plate 150. The two PCB supporting devices 140, 142 cooperate with each other to support the single PCB 22. Otherwise, it can be said that a single PCB supporting device is provided in the form of the two separate parts 140, 142.

Each of the support plates 148, 150 has a generally rectangular shape, and is formed of a synthetic resin such as a phenolic resin. As shown in FIG. 3, each support plate 148, 150 has a closed groove 160 which is formed, along an outer peripheral edge thereof, in one surface thereof to which the PCB supporting member or members 152, 154, 156 is or are fixed. The function of the groove 160 will be described later. Each support plate 148, 150 has two positioning blind holes 162, 164 each as a sort of positioning portion. The first positioning hole 162 has a circular cross section, and the second positioning hole 164 has an elliptic cross section. Each support plate 148, 150 has two bolt holes 166 which are formed through the thickness thereof. The PCB supporting members 152, 154, 156 will be described later.

From the upper surface of the second table 120, two pairs of positioning projections 168 each as a sort of positioning portion project upward. Each of the four projections 168 has a circular cross section, and each pair of projections 168 are fitted in the corresponding pair of holes 162, 164, respectively. Thus, the support plates 148, 150 (or the PCB supporting devices 140, 142) are positioned relative to the second table 120 and, in this state, four bolts 170 are screwed into the respective bolt holes 166 and then into the second table 120. Thus, the PCB supporting devices 140, 142 are fixed to the second table 120.

The positioning blind holes 162, 164 of each support plate 148, 150 may be replaced with positioning through-holes which are formed through the thickness of the each support plate 148, 150. In addition, the positioning projections 168 of the second table 120 may be replaced with positioning pins which extend through the thickness of each support plate 148, 150. Moreover, each support plate 148, 150 may be provided with positioning projections or pins as positioning portions, and the second table 120 may be provided with positioning blind holes or through-holes as positioning portions. In the last case, too, each support plate 148, 150 can be positioned relative to the second table 120 by the fitting of the projections or pins in the blind holes or through-holes, respectively.

When a PCB 22 is carried in, the pair of conveyor belts of the PCB carry-in device and the pair of conveyor belts 106 of the PCB P-S device 26 are driven or circulated. At this point of time, the first table 70 is kept at its upper movement end position, and the second table 120 is kept at its lower movement end position. Thus, as the two pairs of conveyor belts are circulated, the PCB 22 is carried in onto the PCB P-S device 26. The movement of the PCB 22 is stopped by a stopper (not shown) which is currently kept at its operative position. After the pair of conveyor belts 106 are stopped, the second table 120 is moved upward relative to the first table 70. When the second table 120 is elevated, the table 120 engages the engaging pins 114, thereby causing the projecting members 110 to be moved upward against the biasing forces of the springs 112. Consequently the PCB 22 is lifted up away from the conveyor belts 106. As the second table 120 is elevated, the main and secondary PCB positioning pins 132 and the two PCB supporting devices 140, 142 are elevated, so that the two positioning pins 192 are fitted in a main and a secondary positioning hole 172, 174 (FIGS. 2 and 6) of the PCB 22, respectively. Thus, the PCB 22 is positioned relative to the second table 120. In addition, the PCB supporting members 152, 154, 156 of the PCB supporting devices 140, 142 contact respective portions of the first surface 144 of the PCB 22 that are free from the ECs 146 mounted on the first surface 144. Thus, the PCB supporting devices 140, 142 support the PCB 22 on the side of the first surface 144. When the PCB 22 is lifted up by the projecting members 110 and is just contacted with the hold-down portions 94, 96, the PCB supporting members 152, 154, 156 contact the PCB 22, and the main and secondary PCB positioning pins 132 are fitted in the main and secondary PCB positioning holes 172, 174 to position the PCB 22. The PCB 22 is positioned by the two positioning pins 132, and is sandwiched and supported by the hold-down portions 94, 96 and the projecting members 110, and its lower surface is supported by the PCB supporting members 152, 154, 156.

Subsequently, the first table 70 is lowered. When ECs 146 are mounted on the PCB 22, the X table 58 and the Y table 66 are moved so that the PCB 22 is moved to an arbitrary position on a horizontal plane. Thus, it can be said that the first table 70 provides a movable table which supports and moves the PCB 22, or it can be said that the second table 120 provides the movable table. Otherwise, it can be said that both the first and second tables 70, 120 provide the movable table, or it can be said that the Y table 66 provides the movable table which supports the PCB 22 via the first and second tables 70, 120.

The plurality of EC suction heads 16 of the EC mounting device 10 are sequentially moved to the EC-suck position, as the index table 14 is intermittently rotated. At the EC-suck position, each of the EC suction heads 16 sucks and holds an EC 146 from the EC-supply portion of one EC feeder 32 being positioned at the EC-supply position. Subsequently, each head 16 is moved to the EC-mount position via the EC-posture-detect and -correct positions. At the EC-mount position, each head 16 mounts the EC 146 on the second surface 147 of the PCB 22. Each head 16 is supported by the index table 14, such that the each head 16 is lowered and then elevated, relative to the index table 14, for sucking or mounting the EC 146.

After all ECs 146 to be mounted on the PCB 22 have been mounted on the PCB 22, the X and Y tables 58, 66 are returned to their origin positions where the PCB P-S device 26 discharges the PCB 22 onto the PCB carry-out device. Then, the first table 70 is moved upward to its upper movement end position and the second table 120 is moved downward to its lower movement end position. Consequently the main and secondary positioning pins 132 are disengaged from the main and secondary positioning holes 172, 174, respectively, the PCB supporting members 152, 154, 156 of the PCB supporting devices 140, 142 are separated from the first surface 144, and the projecting members 110 are moved away from the hold-down portions 94, 96. Thus, the PCB 22 is released from the PCB P-S device 26. Then, the pair of conveyor belts of the PCB carry-out device and the pair of conveyor belts 106 of the PCB P-S device 26 are driven or circulated, so that the PCB 22 is discharged from the device 26 onto the carry-out device. After the discharging of the PCB 22, or concurrently with the discharging of-the PCB 22, another PCB 22 on which ECs 146 are next to be mounted is carried in onto the PCB P-S device 26.

Since the support plates 148, 150 of the PCB supporting devices 140, 142 arranged side by side as shown in FIG. 3 are smaller than the second table 120, the engaging pins 114 engage respective portions of the second table 120 that are free from the support plates 148, 150. As described above, the distance between the fixed guide 90 and the movable guide 92 (i.e., the PCB-guide width) is adjustable by moving the pair of block members (not shown) relative to the first table 70 in the Y direction. Since those block members are provided outside the second table 120 in the X direction and the movable guide 92 crosses over the second table 120, the guide 92 does not interfere with the PCB supporting devices 148, 150, when the PCB-guide width of the PCB P-S device 26 is adjusted. That it, even in the case where after the current or first sort of PCBs 22 having a first size, a second sort of PCBs 22 having a second size different from the first size, are used, the second table 120 can be used for positioning and supporting the second sort of PCBs 22, and different sorts of PCB supporting devices for the second sort of PCBs can employ the support plates 148, 150 though those PCB supporting devices may employ different sorts of PCB supporting members to be fixed to respective portions of the support plates 148, 150.

Next, there will be described the manner in which the PCB supporting devices 140, 142 are produced, and the PCB supporting members 152, 154, 156 which are used for producing the PCB supporting devices 140, 142.

Figure 4:
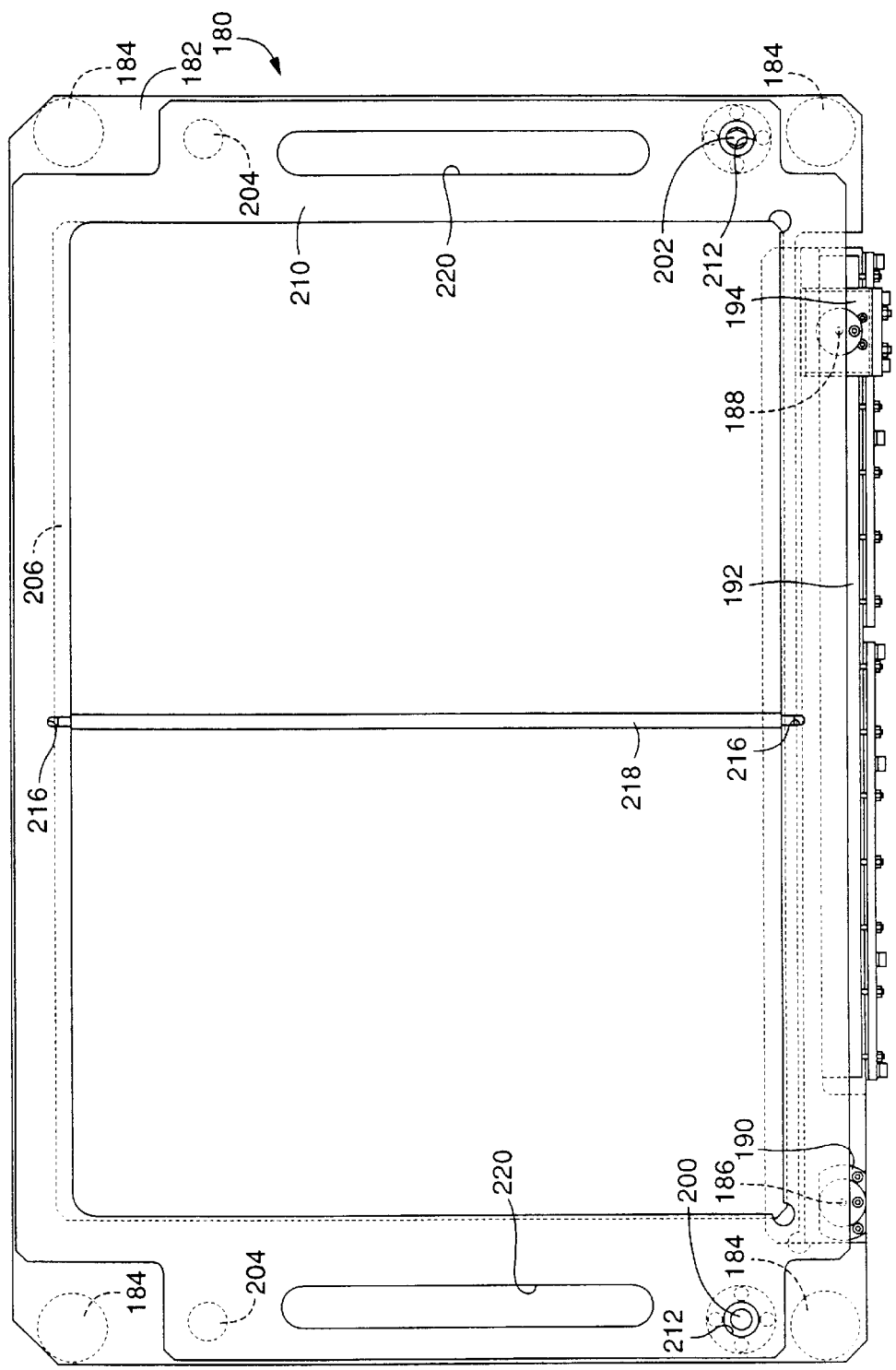
FIG. 4 is a plan view of a jig used for producing the PCB supporting devices of FIG. 3.
Figure 5:
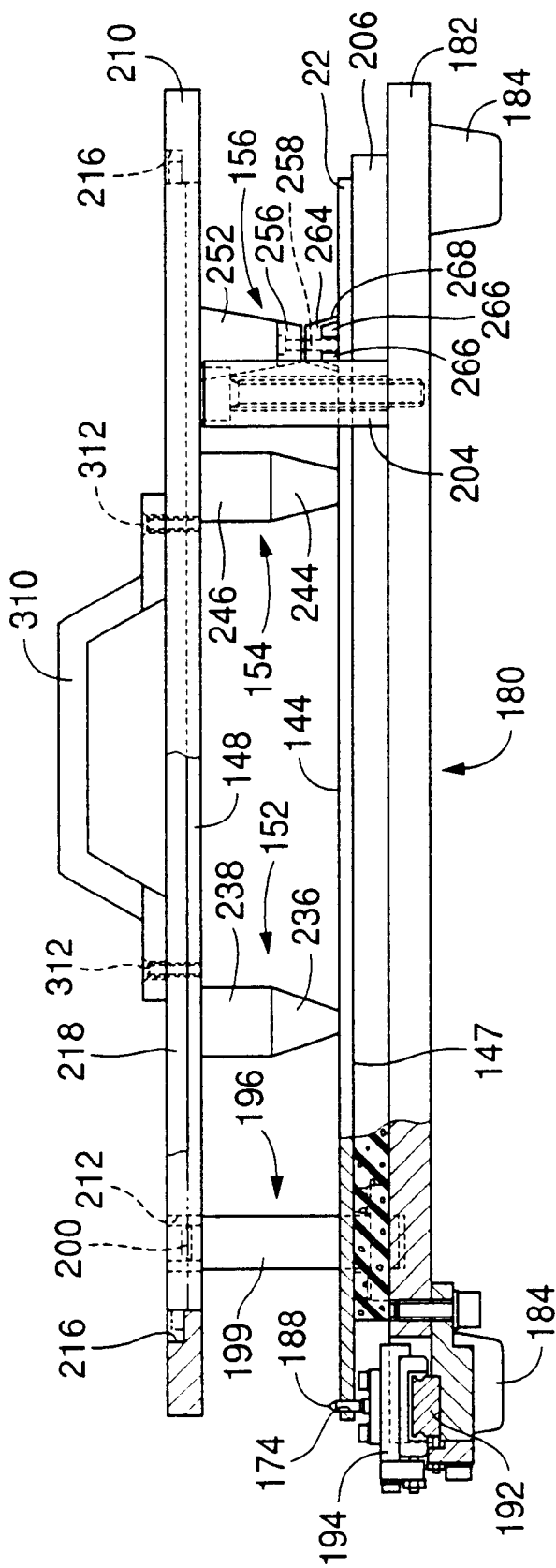
FIG. 5 is a partly cross-sectioned, side elevation view of the jig of FIG. 4 and the PCB supporting devices of FIG. 3.
Figure 6:
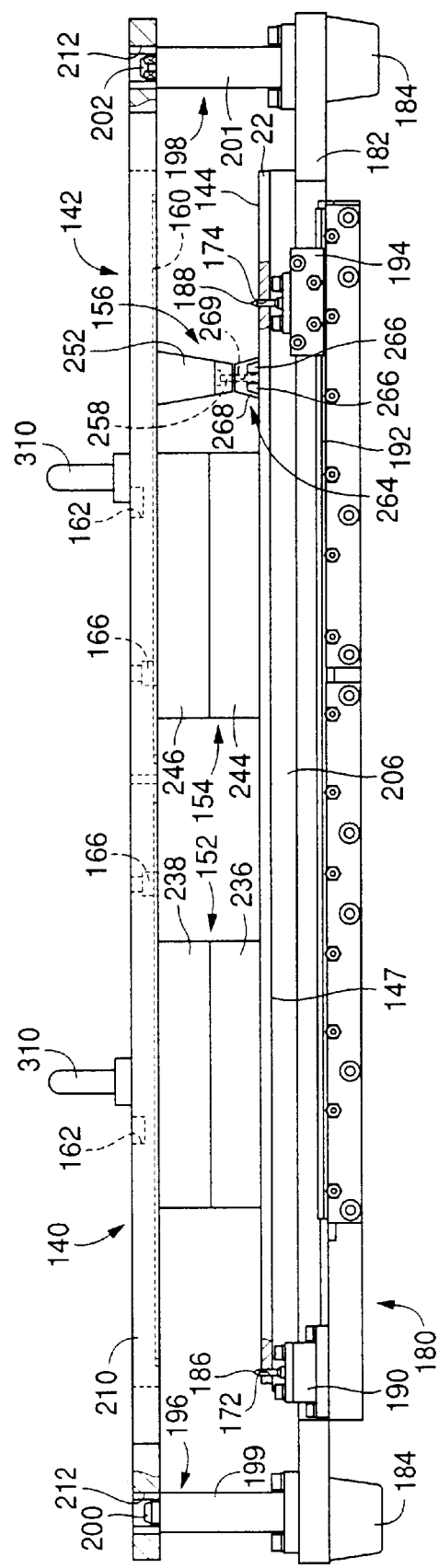
FIG. 6 is a partly cross-sectioned, front elevation view of the jig of FIG. 4 and the PCB supporting devices of FIG. 3.

The PCB supporting devices 140, 142 are produced using a jig 180 shown in FIGS. 4, 5, and 6. The jig 180 includes a PCB holding member 182. The PCB holding member 182 has a plate-like shape, and is placed on an operation table via a plurality of leg members 184 fixed to one surface of the holding member 182. A main and a secondary PCB positioning pin 186, 188 are attached to one of widthwise opposite end portions of the other surface of the PCB holding member 182, such that the two positioning pins 186, 188 are distant from each other in a lengthwise direction of the holding member 182.

The main PCB positioning pin 186 is fixed to a block member 190 fixed to one of lengthwise opposite end portions of the PCB holding member 182, such that the main pin 186 projects upward in a direction perpendicular to the plane of the holding member 182. A guide rail 192 is fixed to the PCB holding member 182 such that the guide rail 192 extends parallel to the lengthwise direction of the holding member 182. A block member 194 is movably fitted on the guide rail 192, and the secondary PCB positioning pin 188 is fixed to the block member 194 such that the secondary pin 188 projects upward in a direction perpendicular to the plane of the holding member 182. As the block member 194 is moved on the guide rail 192, the secondary pin 188 is moved toward, and away from, the main pin 186, so that the distance between the two pins 186, 188 is adjusted.

The main and secondary PCB positioning pins 186, 188 are provided on the jig 180 such that in the state in which the first surface 144 of the PCB 22 on which the ECs 146 have been mounted faces upward, the main PCB positioning pin 186 can be fitted in the main PCB positioning hole 172 of the PCB 22 and the secondary PCB positioning pin 188 can be fitted in the secondary PCB positioning hole 174 of the PCB 22. Thus, the two pins 186, 188 cooperate with each other to position the PCB 22 relative to the PCB holding member 182.

Figure 7:
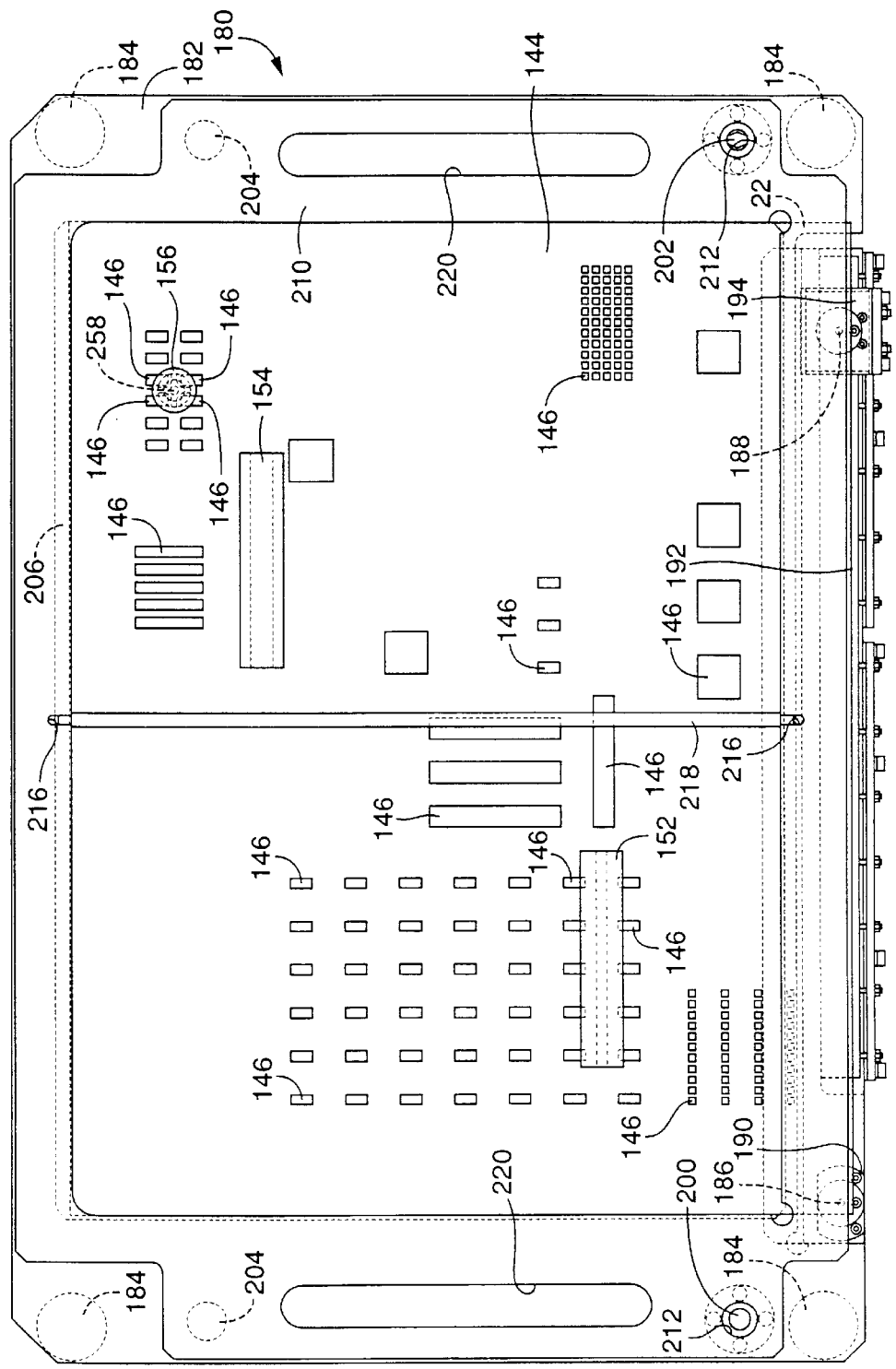
FIG. 7 is a plan view showing a state in which a PCB is set on the jig of FIG. 4 and PCB supporting members are placed on the PCB.

As shown in FIG. 6, a main frame positioning member 196 and a secondary frame positioning member 198 stand on the PCB holding member 182. The main frame positioning member 196 includes a cylindrical base portion 199, and a cylindrical, positioning projection 200 which is provided on an upper end of the base portion 199 and which has a diameter smaller than that of the base portion 199. The main member 196 is provided on the side of the main PCB positioning pin 186 as seen in the direction in which the main and secondary PCB positioning pins 186, 188 are distant from each other. The secondary frame positioning member 198 includes a cylindrical base portion 201, and a positioning projection 202 which is provided on an upper end of the base portion 201 and which is obtained by chamfering a pair of diametrically opposite portions of a cylindrical member. The secondary member 198 is provided on the side of the secondary PCB positioning pin 188. As shown in FIGS. 5 and 7, two frame supporting members 204 stand on the PCB holding member 182, such that the two frame supporting members 204 are distant from the main and secondary frame positioning members 196, 198, respectively, in respective directions perpendicular to the direction in which the main and secondary members 196, 198 are distant from each other. A cushion plate 206 formed of a sponge rubber is fixed to a central portion of the PCB holding member 182. However, the cushion plate 206 may be replaced with any one whose thickness is variable due to its elastic deformation.

The main and secondary frame positioning members 196, 198 cooperate with each other to position a frame 210 relative to the PCB holding member 182. As shown in FIG. 4, the frame 210 has a generally rectangular shape with a large central opening, and has two frame positioning holes 212 at respective positions which are distant from each other in a lengthwise direction of the frame 210. The respective positioning projections 200, 202 of the main and secondary members 196, 198 are fitted in the two frame positioning holes 212, respectively, via respective bushings, so that the frame 210 is positioned relative to the PCB holding member 182 and is supported on the respective base portions 199, 201 of the main and secondary members 196, 198 and the two frame supporting members 204. The respective base portions 199, 201 of the main and secondary members 196, 198 and the two frame supporting members 204 have respective lengths which define, between the frame 210 and the first surface 144 of the PCB 22 placed on the cushion plate 206, a space having a dimension greater than the height of the greatest one of the ECs 146 mounted on the first surface 144. An electric circuit is provided by various sorts of ECs 146 having different heights. Here, it is assumed that the ECs 146 mounted on the first surface 144 of the PCB 22 include the greatest EC 146 that has the greatest height.

As shown in FIGS. 5 and 6, the frame 210 has a pair of recesses 216 midway in the direction in which the main and secondary frame positioning members 196, 198 are distant from each other. Opposite end portions of a bar-like area indicating member 218 are fitted in the two recesses 216, respectively. The area indicating member 218 divides an inner space of the frame 210 into two equal half spaces in the direction in which the main and secondary members 196, 198 are distant from each other. The frame 210 and the area indicating member 218 cooperate with each other to provide an area indicating device. The frame 210 has two elongate holes 220 which are formed in two side portions thereof, respectively, which are perpendicular to the direction in which the main and secondary members 196, 198 are distant from each other. The two elongate holes 220 extend parallel to the two side portions, respectively. Respective portions of the frame 210 that define the two elongate holes 220 provide two grips for an operator to take the frame 210.

When the PCB supporting devices 140, 142 are produced, first, the position of the secondary PCB positioning pin 188 is adjusted to the size of the PCB 22 by the operator. Then, as shown in FIG. 7, in the state in which the first surface 144 of the PCB 22 on which the ECs 146 have been mounted faces upward, the main and secondary PCB positioning pins 186, 188 are fitted in the main and secondary PCB positioning holes 172, 174 of the PCB 22, respectively, so that the PCB 22 is positioned relative to the PCB holding member 182 and is placed on the cushion plate 206. Meanwhile, the main and secondary PCB positioning pins 132 provided on the second elevator table 120 of the PCB P-S device 26 can be fitted in the main and secondary holes 172, 174 of the PCB 22, respectively, so that the PCB 22 is positioned relative to the second table 120. Hence, the PCB 22 is positioned relative to the PCB holding member 182, while taking the same state as the state which the PCB 22 takes when being turned, from the state in which the PCB 22 is positioned relative to the second table 120, upside down about a horizontal center line of the PCB 22 as seen in the direction in which the main and secondary holes 172, 174 are distant from each other. Thus, the main and secondary positioning pins 186, 188 and the block members 190, 194 cooperate with each other to provide a first positioning device.

Here, it is assumed that the PCB 22 is the largest one of various sorts of PCBs for each of which the jig 180 can be used to produce a PCB supporting device. The PCB 22 is larger than the inner space of the frame 210, and the secondary PCB positioning pin 188 is positioned at the most distant position from the main PCB positioning pin 186. The block member 194 to which the secondary pin 188 is fixed is not fixed to the guide rail 192, but the PCB 22 has a certain degree of rigidity. Therefore, in the state in which the secondary pin 188 is fitted in the secondary hole 174 of the PCB 22, the secondary pin 188 is positioned in the "pin" direction in which the main and secondary pins 186, 188 are distant from each other and -accordingly the PCB 22 is positioned in a direction parallel to the "pin" direction, and in a direction perpendicular to the "pin" direction and parallel to the plane of the PCB holding member 182.

Next, the respective positioning projections 200, 202 of the main and secondary frame positioning members 196, 198 are fitted in the two frame positioning holes 212 of the frame 210, respectively. Then, the frame 210 is placed on the frame supporting members 204, and the area indicating member 218 is set on the frame 210. In addition, the operator places, while seeing the ECs 146 mounted on the PCB 22, the PCB supporting members 152, 154, 156 on respective portions of the first surface 144 of the PCB 22 that are free from the ECs 146. The operator can select appropriate portions of the first surface 144, while he or she visually confirms that the PCB supporting members 152–156 placed on the selected portions of the first surface 144 do not interfere with the ECs 146 mounted on the first surface 144.

In this operation, the operator is required to place the PCB supporting members 152, 154, 156 on the first surface 144, within only two areas surrounded or defined by the frame 210 and the area indicating member 218. That is, the operator is inhibited from placing the supporting members 152–156 on respective portions of the first surface 144 that correspond to the frame 210 and the area indicating member 218. Thus, the supporting members 152–156 are prevented from being placed on the inhibiting portions (or areas) of the first surface 144. The inhibiting portions of the first surface 144 include, e.g., the portions which are to be supported by the pair of conveyor belts 106 of the PCB P-S device 26. Generally, the inhibiting portions are the portions which are to be contacted with a certain member or members other than the ECs 146 and accordingly must not be supported by the PCB supporting members 152–156. Here, the inhibiting portions include the outer peripheral portion of the first surface 144. In addition, since the area indicating member 218 is provided at a central position on the frame 210, the operator is prevented from placing the PCB supporting members 152–156 on a central portion of the first surface 144 that corresponds to the boundary between the two PCB supporting devices 140, 142. In the case where the area indicating member 218 is not employed, the operator may place one or more PCB supporting members 152–156 on the central portion of the first surface 144, and the one supporting member 152–156 or each of the supporting members 152–156 may be fixed to both the two support plates 148, 150.

Various sorts of PCB supporting members including the supporting members 152, 154, 156 are used for producing the PCB supporting devices 140, 142. The operator selects and uses an appropriate one or ones of the various sorts of PCB supporting members, depending upon the shapes, sizes, density, and layout of the ECs 146 mounted on the first surface 144 of the PCB 22. FIGS. 3 to 8 show the PCB supporting members 152–156 as representatives of all the supporting members placed on the support plates 148, 150.

Figure 9:
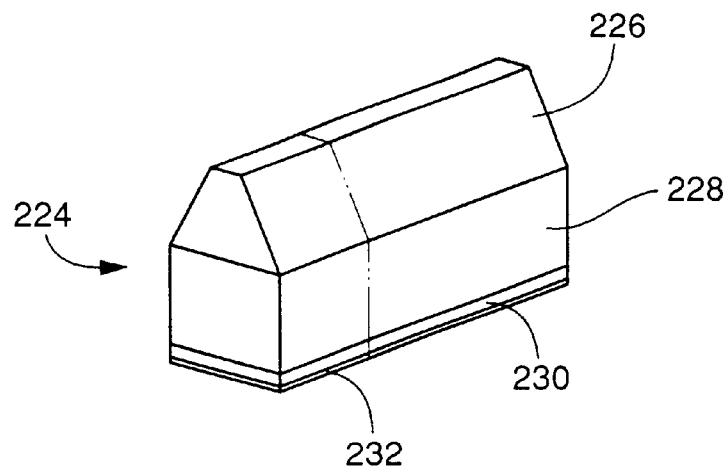
FIG. 9 is a perspective view of a material for providing PCB supporting members.

The first PCB supporting member 152 is obtained from a material 224, shown in FIG. 9, for providing a plurality of PCB supporting members. The material 224 includes a vibration damping layer 226 which has a trapezoidal cross section, has an elongate shape, and is formed of a vibration damping rubber; and a secondary layer 228 which has a rectangular cross section, is formed of a foamed material (e.g., urethane rubber), and is fixed to a lower surface of the vibration damping layer 226 with an appropriate device such as an adhesive. The material 224 additionally includes a tacky layer 230 formed on a lower surface of the secondary layer 228; and a peelable sheet 232 which covers the tacky layer 230 and is peelable from the same 230. More specifically described, the tacky layer 230 is provided by a tacky tape which includes a cloth tape and two tacky layers formed on opposite surfaces of the cloth tape. Thus, one of the two tacky layers of the tacky tape is fixed to the secondary layer 228, and the peelable sheet 232 covers the other tacky layer of the tacky tape. The height of the material 224, i.e., the dimension of the same 224 in the direction in which the vibration damping layer 226 and the secondary layer 228 are arranged, is greater than the height of the greatest EC 146.

The vibration damping rubber used as the vibration damping layer 226 is a rubber which exhibits an excellent impact and vibration absorbing ability and which reacts little to an external force exerted thereto and absorbs the external energy. The vibration damping rubber may be, e.g., a rubber known as the product name, 'Hanenite', available from Naigai Kabushiki Kaisha, Japan. The physical properties and life expectancy of this rubber are comparable to those of common rubbers. This rubber exhibits an excellent vibration damping ability at an ordinary-temperature range of 5 to 35° C., and exhibits a less than 10% impact resilience. Moreover, this rubber has a moldability comparable to those of common rubbers, and is strongly adherable to a metal member. In the case where this rubber is provided in the form of a sheet, it can be easily cut or punched.

When the first PCB supporting device 140 is produced, first, the operator peels the peelable sheet 232 and cuts a portion of the material 224 along a vertical plane, indicated at two-dot chain line in FIG. 9, which intersects a lengthwise direction of the material 224. The operator places the thus obtained PCB supporting member 152 on a portion of the first surface 144 that is free from the ECs 146, such that the vibration damping layer 226 is contacted with the first surface 144. The vibration damping layer 226 of the material 224 provides a vibration damping portion 236 of the supporting member 152, and the secondary layer 228 provides a secondary portion 238 of the same 152. The tacky layer 230 of the material 224 provides a tacky layer of the supporting member 152, and the vibration damping portion 236 provides a contact portion which is contacted with the first surface 144 of the PCB 22. The dimension of the PCB supporting member 152 as measured in a PCB-support direction perpendicular to the first surface 144 of the PCB 22, i.e., in the direction in which the vibration damping portion 236 and the secondary portion 238 are arranged, is greater than the height of the greatest EC 146. This dimension of the supporting member 152 is the height of the same 152 which is fixed to the support plate 148. The material 224 can be cut by a cutter which is manually operated by the operator.

Like the first PCB supporting member 152, the second PCB supporting member 154 is obtained from a PCB-supporting-member material (not shown) which includes a vibration damping layer, a secondary layer formed of a foamed material (e.g., urethane rubber), a tacky layer, and a peelable sheet which covers the tacky layer. The second member 154 includes a vibration damping portion 244 which provides a contact portion, a secondary portion 246, and a tacky layer (not shown). However, an upper surface of the vibration damping portion 244 of the second PCB supporting member 154 is larger than that of the vibration damping portion 236 of the first PCB supporting member 152: Therefore, the first supporting member or members 152 is or are used, as shown in FIG. 7, for supporting a portion or portions of the first surface 144 on which the ECs 146 are mounted at a high density and only small vacant spaces are left among the ECs 136. The second supporting member or members 154 is or are used for supporting a portion or portions of the first surface 144 on which the ECs 146 are mounted at a low density. The dimension of the second supporting member 154 in its PCB-support direction is greater than the height of the greatest EC 146, and is equal to that of the first supporting member 152. Since each of the vibration damping portions 236, 244 has a trapezoidal cross section, each of the damping portions 236, 244, that is, each of the contact portions can contact, at a small area thereof, a portion of the first surface 144 on which the ECs 146 are mounted at a high density and only a small space is left between each pair of adjacent ECs 146. In addition, each contact portion can stably damp vibration without buckling.

Figure 8:
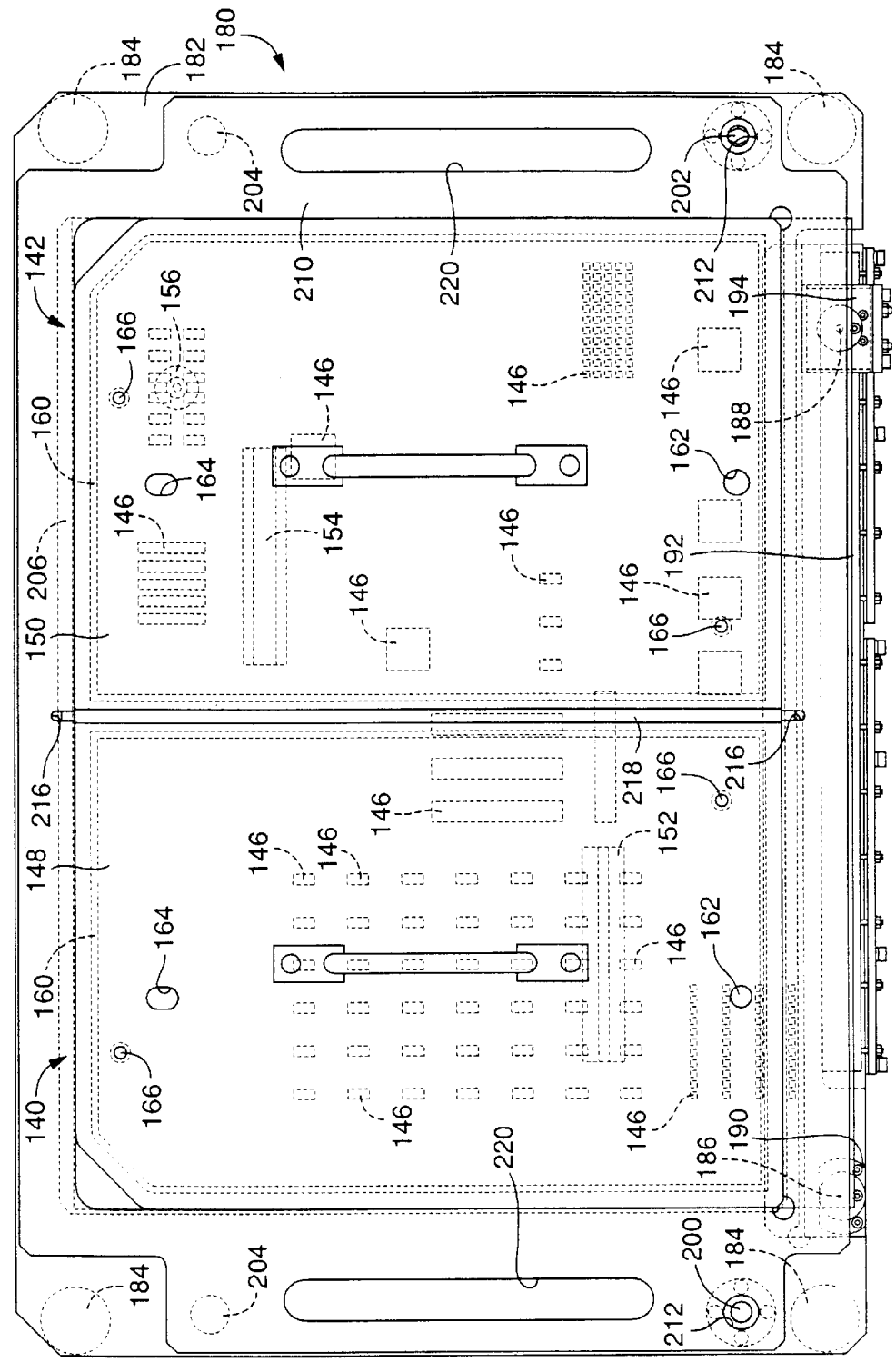
FIG. 8 is a plan view showing a state in which support plates are placed on the PCB supporting members of FIG. 7.

As shown in FIG. 2, the third PCB supporting member 156 includes a secondary portion 252 formed of a foamed material (e.g., urethane rubber), a tacky layer (not shown) provided on a lower surface of the secondary portion 252, a vibration damping portion 256 which is formed of a vibration damping rubber and which is fixed to an upper surface of the secondary portion 252, and a metallic support pin 258 which projects upward from the vibration damping portion 256 and which provides a contact portion. A cross section of the support pin 258 taken by a plane perpendicular to the PCB-support direction of the member 256 has an area smaller than that of the vibration damping portion 256. Therefore, as shown in FIG. 8, the third PCB supporting member or members 156 is or are contacted with a portion or portions of the first surface 144 on which the ECs 146 are mounted at a very high density. The dimension of the third PCB supporting member 156 in its PCB-support direction, that is, the length of the member 156 between the end surface of the support pin 258 and the tacky layer, is equal to those of the first and second PCB supporting members 152, 154, and is greater than the height of the greatest EC 146.

A supporter 264 is used when the third PCB supporting member 156 is placed on the first surface 144 of the PCB 22, as shown in FIG. 6. The supporter 264 is obtained by forming four cutouts 266 in a member having a circular cross section, such that the four cutouts 266 are equiangularly spaced from one another about a center axis line of the member, and open in one of axially opposite end surfaces of the member and in an outer circumferential surface of the member. Thus, the supporter 264 includes a support portion 268 having a generally X-shaped cross section. The supporter 264 has a central axial hole 269 which is formed therethrough along its center axis line. When the operator places the third PCB supporting member 156 on the PCB 22, first, the operator places the supporter 264 on the PCB 22 such that the support portion 268 of the supporter 264 is positioned among four ECs 146, while he or she carefully prevents the supporter 264 from contacting those ECs 146. Next, the support pin 258 of the third member 156 is fitted in the central axial hole 269 of the supporter 264, till the tip of the pin 258 contacts the PCB 22. The third member 156, being upside down, cannot stand by itself because the secondary portion 252 rides on the support pin 258. However, the supporter 264 can support the third member 156 on the PCB 22 such that the support pin 258 contacts the PCB 22 and the secondary portion 252 rests on the pin 258 supported by the supporter 264.

Figure 10:
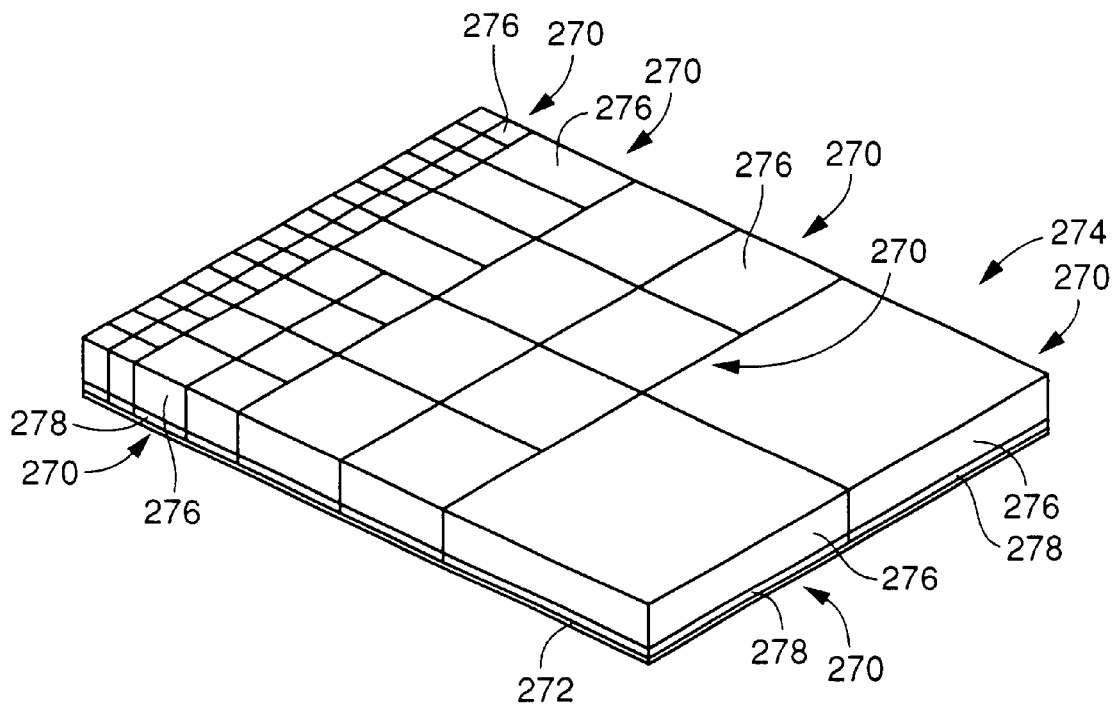
FIG. 10 is a perspective view of a kit for providing PCB supporting members.

FIG. 10 shows a kit 274 for providing PCB supporting members 270 as examples of the various PCB supporting members other than the PCB supporting members 152, 154, 156. The kit 274 includes a peelable sheet 272 as a common base member to which the PCB supporting members 270 each of which has a rectangular or square cross section are detachably attached via respective tacky layers thereof. The kit 274 is produced by applying a tacky material to one surface of a large plate-like vibration damping rubber, covering the thus formed tacky layer with the peelable sheet 272, and cutting the vibration damping rubber and the tacky layer into the rectangular or square PCB supporting members 270 having different sizes, without cutting the peelable sheet 272. Each of the PCB supporting members 270 includes a vibration damping portion 276 and a tacky layer 278 formed on one end surface of the vibration damping portion 276, and the vibration damping portion 276 provides a contact portion which contacts the first surface 144 of the PCB 22. The peelable sheet 272 exhibits a lower degree of tackiness to the tacky layer 278 than the one end surface of the vibration damping portion 276. Thus, each PCB supporting member 270 including its tacky layer 278 is easily detached from the peelable sheet 272.

Figure 11:
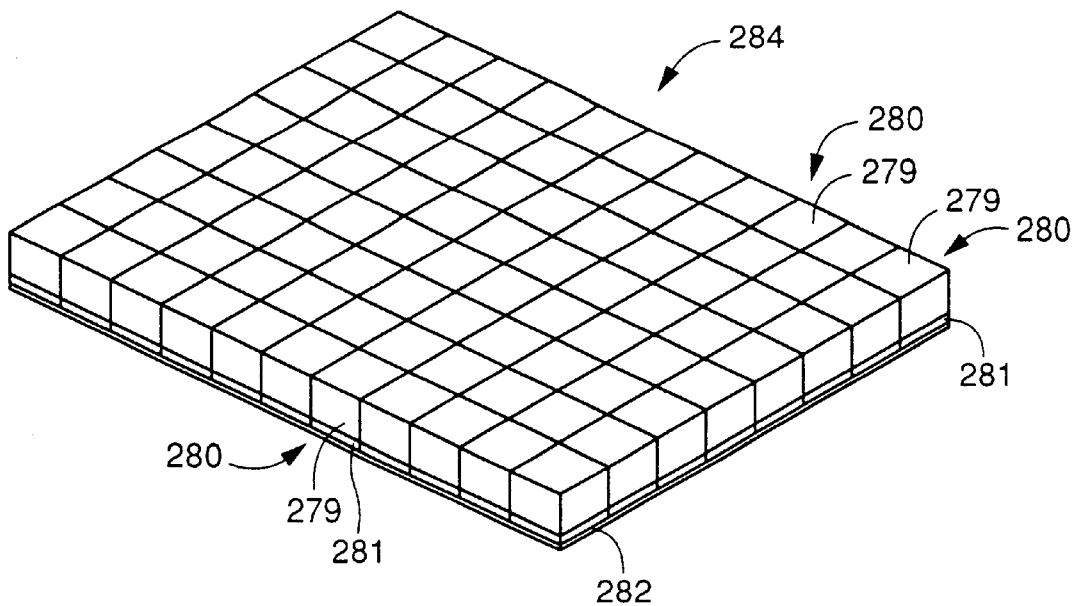
FIG. 11 is a perspective view of another kit for providing PCB supporting members.
Figure 12A:
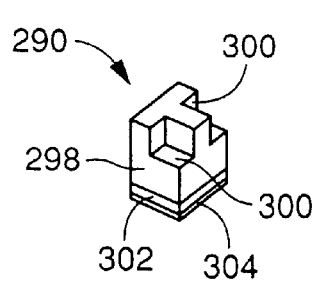
FIGS. 12A, 12B, 12C, and 12D are respective views of different PCB supporting members.
Figure 12B:
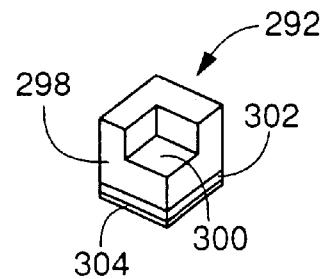
Figure 12C:
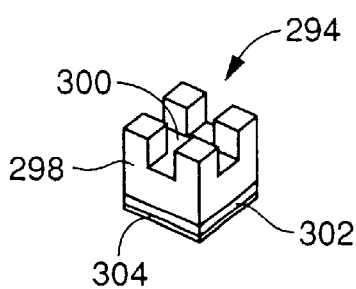
Figure 12D:
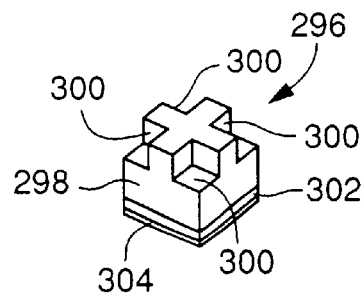

FIG. 11 shows another kit 284 for providing PCB supporting members 280 as examples of the various PCB supporting members other than the PCB supporting members 152, 154, 156. The kit 284 includes a peelable sheet 282 as a common base member to which the PCB supporting members 280 each of which has an identical shape and identical dimensions are detachably attached via respective tacky layers thereof. The kit 284 is produced by applying a tacky material to one surface of a large plate-like vibration damping rubber, covering the thus formed tacky layer with the peelable sheet 282, and cutting the vibration damping rubber and the tacky layer into the identical PCB supporting members 280, without cutting the peelable sheet 282. Each of the PCB supporting members 280 includes a vibration damping portion 279 and a tacky layer 281 formed on one end surface of the vibration damping portion 279, and the vibration damping portion 279 provides a contact portion which contacts the first surface 144 of the PCB 22. The peelable sheet 282 exhibits a lower degree of tackiness to the tacky layer 281 than the one end surface of the vibration damping portion 279. Thus, each PCB supporting member 280 including its tacky layer 281 is easily detached from the peelable sheet 282.

The dimension of each PCB supporting member 270, 280 in its PCB-support direction, substantially equal to the dimension of each vibration damping portion 276, 279 in the PCB-support direction, is greater than the height of the greatest EC 146, and are equal to that of each of the PCB supporting members 152, 154, 156.

FIGS. 12A, 12B, 12C, and 12D show respective PCB supporting members 290, 292, 294, 296 as examples of the various PCB supporting members other than the PCB supporting members 152, 154, 156. Each of the PCB supporting members 290, 292, 294, 296 includes a vibration damping portion 298 formed of a vibration damping rubber, and the vibration damping portion 298 provides a contact portion which contacts the first surface 144 of the PCB 22. Each of the vibration damping portions 298 has one or more recesses 300, so that a profile of a horizontal cross section of the each portion 298 includes an inwardly deformed portion corresponding to the recess or recesses 300. The shape, dimensions, and number of the recess or recesses 300 of each vibration damping portion 298 are predetermined based on the shape, dimensions, and number of the ECs 146 mounted on the first surface 144 of the PCB 22, such that the each portion 298 does not interfere with the ECs 146 owing to the recess or recesses 300. Each of the PCB supporting members 290, 292, 294, 296 includes a tacky layer 302 formed on one end surface of the vibration damping portion 298 thereof that is opposite to the recess or recesses 300 of the portion 298; and a peelable sheet 304 which covers the tacky layer 302. The dimension of each PCB supporting member 290, 292, 294, 296 in its PCB-support direction is greater than the height of the greatest EC 146, and are equal to that of each of the PCB supporting members 152, 154, 156.

Figure 13:
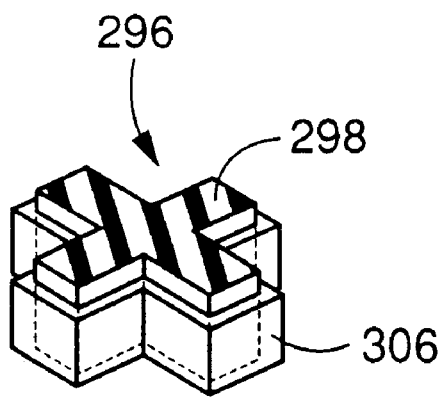
FIG. 13 is a perspective view of a spacer member used for placing a PCB supporting member on a PCB.
Figure 14:
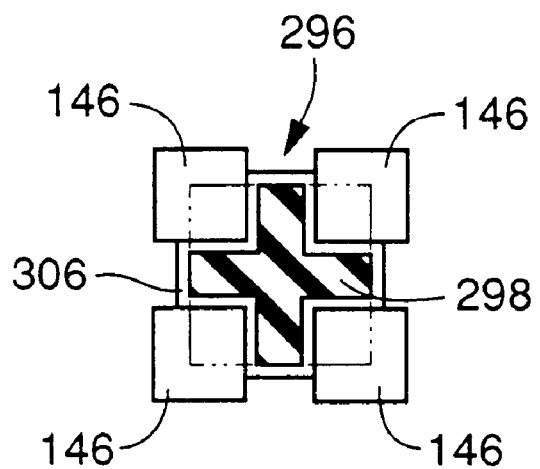
FIG. 14 is a partly cross-sectioned, plan view of the space member and the PCB supporting member of FIG. 13.

FIGS. 13 and 14 shows a spacer member 306 which may be used when the above-described fourth PCB supporting member 296, for example, is placed on the first surface 144 of the PCB 22. Various spacer members having different shapes corresponding to the respective shapes of the vibration damping portions 298 (i.e., the contact portions) of the other PCB supporting member 290, 292, 294 may be prepared and used. The spacer member 306 has an inwardly deformed annular shape, has a thickness equal to a clearance which should be left between the PCB supporting member 296 and its adjacent ECs 146, and has a shape corresponding to the horizontal cross section of the vibration damping portion 298 of the member 296. The height of the spacer member 306 is smaller than that of the supporting member 296. When the spacer member 306 is used, first, the spacer member 306 is placed among the ECs 146 and then the vibration damping portion 298 of the supporting member 296 is fitted in an inner space of the spacer member 306. Thus, a clearance is secured between the vibration damping portion 298 and the ECs 146.

Each of the previously-described PCB supporting members 152, 154, 270, 280 (except the member 156) may be placed on the first surface 144 with the help of a corresponding spacer member. Otherwise, each of the PCB supporting members 152, 154 may be placed on the first surface 144 with the help of a corresponding supporter like the supporter 264.

The operator places, on the PCB 22, a sufficient number of PCB supporting members 152, 154, 156 for supporting each of PCBs 22. After the PCB supporting members 152, 154, 156 are placed on the PCB 22, the support plates 148, 150 are placed on the respective secondary portions 238, 246, 252 of the supporting members 152, 154, 156. At this point of time, two grips 310 have been detachably attached, with respective bolts 312 each as a fixing device, to respective one surfaces of the two support plates 148, 150 that are opposite to the respective other surfaces thereof in which the respective grooves 160 are formed. The operator places the support plates 148, 150 on the PCB supporting members 152, 154, 156, while grasping the grips 310. The two support plates 148, 150 are so shaped that the two plates 148, 150, except for respective one corners shown in FIG. 3, are closely fitted in the two spaces, respectively, which are defined by the frame 210 and the area indicating member 218. Thus, the support plates 148, 150 are positioned relative to the PCB holding member 182 via the frame 210. In this state, the operator moves the plates 148, 150 toward the PCB holding member 182, and places the plates 148, 150 on the PCB supporting members 152, 154, 156. Since all the PCB supporting members, including the members 152, 154, 156, that are attached to the support plates 148, 150 have the same height, the first plate 148 is contacted with the first supporting member 152, and the second plate 150 is contacted with the second and third supporting members 154, 156. The height of all the PCB supporting members including the members 152, 154, 156 is greater than those of the ECs 146, and the thickness of the support plates 148, 150 and the height of the PCB supporting members 152–156 are so predetermined that in the state in which the plates 148, 150 are fitted in the frame 210 and are thereby positioned relative to the PCB holding member 182, the plates 148, 150 can be placed on the PCB supporting members 152–156. The inner peripheral portion of the frame 210 that defines the inner space of the frame 210, and the main and secondary frame positioning members 196, 198 for positioning the frame 210 relative to the PCB holding member 182, cooperate with each other to provide a second positioning device.

After the support plates 148, 150 are placed on the PCB supporting members 152, 154, 156, the operator lightly pushes respective upper surfaces of the plates 148, 150 so that the supporting members 152–156 are strongly attached to the plates 148, 150. Since the PCB 22 is placed on the cushion plate 206 formed of a sponge rubber, the cushion plate 206 is elastically deformed even if the thickness of the PCB 22 may not be uniform and accordingly the respective upper ends of the supporting members 152–156 may not be level with one another. Thus, all the supporting members 152–156 are closely attached to the plates 148, 150. Since the peelable sheet 232 is peeled from each of the supporting members 152–156 before the each member 152–156 is placed on the first surface 144, the supporting members 152–156 are attached to the plates 148, 150 owing to the respective tacky layers 230 thereof.

After the PCB supporting members 152, 154, 156 are attached to the support plates 148, 150, the operator draws the support plates 148, 150 out of the frame 210, while grasping the respective grips 310 of the plates 148, 150. Thus, the two PCB supporting devices 140, 142 are obtained. When the PCB supporting devices 140, 142 are attached to the second elevator table 120, the operator removes the grips 310 from the support plates 148, 150, turns the supporting devices 140, 142 upside down, and causes the positioning projections 168 of the second table 120 to be fitted in the positioning holes 162, 164. Thus, the supporting devices 140, 142 are positioned relative to the second table 120 and, in this state, the supporting devices 140, 142 are attached to the second table 120.

When ECs 146 are mounted on the second surface 147 of the PCB 22 that is opposite to the first surface 144 thereof, the PCB 22 is carried in onto the PCB P-S device 26 and stopped on the conveyor belts 106 of the device 26. Then, the second table 120 is elevated so that the PCB 22 is sandwiched between the hold-down portions 94, 96 and the projecting members 110 and the main and secondary PCB positioning pins 132 are fitted in the main and secondary positioning holes 172, 174 of the PCB 22. Thus, the PCB 22 is positioned relative to the second table 120. In addition, the PCB supporting members 152, 154, 156 of the PCB supporting devices 140, 142 contact respective portions of the first surface 144 of the PCB 22 that are free of the ECs 146.

When the PCB supporting devices 140, 142 are produced, the support plates 148, 150 are positioned relative to the PCB 22 owing to the frame 210, the main and secondary frame positioning members 196, 198, the PCB holding member 182, and the main and secondary PCB positioning pins 186, 188. Meanwhile, when the PCB supporting devices 140, 142 are attached to the second elevator table 120 for supporting the PCB 22, the PCB 22 is positioned relative to the second table 120 owing to the main PCB positioning pin (not shown) and the secondary PCB positioning pin 132, and the support plates 148, 150 are positioned relative to the second table 120 owing to the positioning projections 168 and the positioning holes 162, 164. In the latter case, shortly, the support plates 148, 150 are positioned relative to the PCB 22 owing to the main PCB positioning pin (not shown), the secondary PCB positioning pin 132, the second table 120, and the positioning projections 168. When the PCB 22 is positioned relative to the PCB holding member 182, or the second table 120, the main PCB positioning pin 186 of the member 182, or the main PCB positioning pin (not shown) of the second table 120 is fitted in the main positioning hole 172 of the PCB 22, and the secondary PCB positioning pin 188 of the member 182, or the secondary PCB positioning pin 132 of the second table 120 is fitted in the secondary positioning hole 174 of the PCB 22. The positioning holes 162, 164 function for positioning the support plates 148, 150 and the PCB 22 relative to the outer peripheral portions of the plates 148, 150 in the same relationship as that in which the PCB supporting devices 140, 142 are produced; and the positioning projections 168 function for positioning the support plates 148, 150 and the PCB 22 relative to the main PCB positioning pin (not shown) of the PCB P-S device 26 in the same relationship as that in which the PCB supporting devices 140, 142 are produced. Thus, the PCB supporting members 152, 154, 156 are surely contacted with respective portions of the first surface 144 of the PCB 22 that are free of the ECs 146, as the members 152–156 are done when the PCB supporting devices 140, 142 are produced. As described previously, the respective lengths of the PCB supporting members 152–156 in their PCB-support directions are equal to each other, and are greater than the height of the greatest EC 146. Thus, the support plates 148, 150 do not interfere with the ECs 146.

The secondary PCB positioning hole 174 may be an elongate hole. In this case, is particularly preferred the above-described manner in which, when the PCB 22 is positioned relative to the PCB holding member 182, or relative to the second table 120, the main PCB positioning pin 186, or the main PCB positioning pin (not shown) of the second table 120 is fitted in the main positioning hole 172, and the secondary PCB positioning pin 188, or the secondary PCB positioning pin 132 is fitted in the secondary positioning hole 174. However, this preferred manner is not essential to the present invention. That is, it is possible to employ a manner in which, when the PCB 22 is positioned relative to the PCB holding member 182, the main PCB positioning pin 186 may be fitted in the secondary PCB positioning hole 174 and the secondary PCB positioning pin 188 may be fitted in the main PCB positioning hole 172. In the last case, too, the support plates 148, 150 and the PCB 22 are positioned relative to each other in the same relationship, not only when the PCB supporting devices 140, 142 are produced but also when the PCB supporting devices 140, 142 are positioned and supported by the PCB P-S device 26.

The PCB supporting members 152, 154, 156 used for producing the PCB supporting devices 140, 142 include the respective vibration damping portions 236, 244, 256 each of which is formed of a vibration damping rubber. The PCB 22 is subjected to vibration, when the index table 14 is intermittently rotated, when the EC suction head 16 is lowered and the EC 146 held by the head 16 contacts the PCB 22, when the PCB 22 is moved and stopped with the X-Y table 24, or when the EC feeders 32 are move and stopped. However, the energy of the vibration is well damped or absorbed by the vibration damping portions 236, 244, 256 of the supporting members 152–156. Thus, the PCB 22 is prevented from being vibrated. Even if the PCB 22 may be vibrated, this vibration is quickly attenuated by the damping portions 236, 244, 256. Therefore, when the EC 146 is mounted on the PCB 22, the PCB 22 is so still that the EC 146 is accurately mounted at a predetermined EC-mount place on the PCB 22. As described previously, the support plates 148, 150 have the respective grooves 160 which open in the respective surfaces thereof to which the PCB supporting members 152, 154, 156 are fixed. Accordingly, even if one or more of the ECs 146 mounted on the first surface 144 of the PCB 22 may come off the first surface 144 and fall downward, the EC or ECs 146 is or are received by the support plates 148, 150. In addition, since the EC or ECs 146 is or are caught in the grooves 160, the EC or ECs 146 is or are prevented from falling from the support plates 148, 150.

Thus, using the jig 180, the material 224, the kits 274, 284, the supporter 264, and the spacer member 306, the operator or user can easily produce, at low cost, the PCB supporting devices 140, 142 which can support the PCB 22 while minimizing the vibration of the PCB 22 or isolating the PCB 22 from vibration. That is, the operator can produce the supporting devices 140, 142, depending upon the specific sort of the PCB 22, without employing any special molding or machining methods.

In addition, one or more PCB supporting members having special shapes, such as the supporting members 290, 292, 294, 296, can be placed on one or more portions of the first surface 144 of the PCB 22 on which the ECs 146 are mounted at a high density. In this case, one or more spacer members such as the member 306 can be used as interference preventing members to help the operator place safely the supporting members 290–296 on the first surface 144, while preventing the supporting members 290–296 from interfering with the ECs 146. Thus, the PCB 22 can be safely supported by an increased number of PCB supporting members having an increased PCB-support area in total.

In the jig 180, the secondary PCB positioning pin 188 for positioning the PCB 22, is movable toward, and away from, the main PCB positioning pin 186. Since the position of the secondary pin 188 is adjusted relative to the main pin 186, the jig 180 can position each of a plurality of sorts of PCBs having different sizes smaller than that of the largest PCB 22. Thus, the jig 180 can be used for producing one or more PCB supporting devices suitable for each of the plurality of sorts of PCBs having the different sizes.

Using the jig 180, the two PCB supporting devices 140, 142 can be simultaneously produced. In the case where a large PCB is used and two PCB supporting devices are needed for supporting the PCB, the two supporting devices are simultaneously produced using the jig 180. However, in the case where a single PCB supporting device suffices for supporting a certain PCB, the single supporting device is produced using the jig 180. For example, in the case of a PCB whose dimension in the "pin" direction in which the two pins 186, 188 are distant from each other is half that of the largest PCB 22, a single PCB supporting device is produced in such a manner that the secondary pin 188 is moved to a position corresponding to the size of the PCB, the PCB is positioned on the side of the main pin 186, one or more PCB supporting members are placed on a first surface of the PCB through a main-pin-side one of the two half spaces defined by the frame 210 and the area indicating member 218, a support plate is fitted in the one half space, and the supporting member or members is or are attached to the support plate.

In the case where a PCB is used whose dimension in the "pin" direction is not greater than half that of the largest PCB 22 and a single PCB supporting device is produced, the area indicating member 218 may be omitted. It is possible to produce one or more PCB supporting devices for supporting a PCB which is larger than half the largest PCB 22 and smaller than the same 22.

It can be said that the jig 180 is a jig of a sort which produces a single PCB supporting device in the form of the two separate parts 140, 142. The jig 180 may be replaced with a jig of a different sort which produces a single PCB supporting device in the form of four or more separate parts. The greater the total number of separate parts of a single PCB supporting device is, the larger PCB is supported by the PCB supporting device. However, a large PCB may be supported by a single PCB supporting device including a single support plate whose size corresponds to the large PCB. For example, the area indicating member 218 is not employed in the jig 180, and a single support plate corresponding to the inner space of the frame 210 is fitted in the inner space of the frame 210 and is placed on one or more PCB supporting members. A single PCB supporting device including the single support plate is obtained by attaching an end surface or surfaces of the PCB supporting member or members to the single plate.

In the first embodiment shown in FIGS. 1 to 14, it is assumed that the ECs 146 mounted on the first surface 144 of the PCB 22 includes the greatest EC 146 and that the respective dimensions of all the PCB supporting members 152, 154, 156 in their PCB-support directions are equal to one another and are greater than the height of the greatest EC 146. However, one or more tall PCB supporting members and one or more short PCB supporting members may be used with each other, in the case where the ECs 146 mounted on the first surface 144 includes one or more greatest ECs 146 and one or more shorter ECs 146 (e.g., ECs 146 not taller than half the height of the greatest ECs 146). In this case, a PCB supporting device may be produced using a support plate having a uniform thickness and one or more height-adjust plates.

Figure 15:
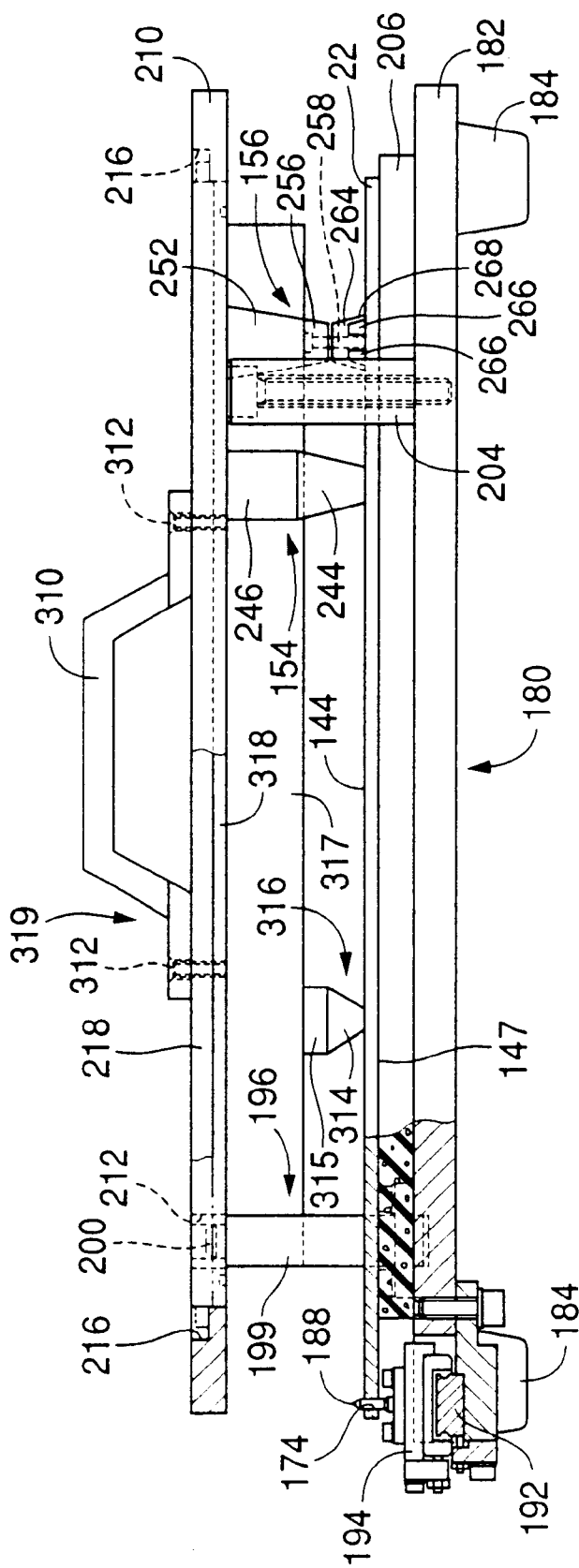
FIG. 15 is a partly cross-sectioned, side elevation view for explaining a manner in which a PCB supporting device is produced using a height-adjust plate.

For example, it is assumed that all the ECs 146 mounted on a half portion of the first surface 144 of the PCB 22 which half portion is to be supported by the PCB supporting device 140, are shorter than the height of the greatest EC 146. In this case, the PCB supporting device 140 may be replaced with a PCB supporting device 319 shown in FIG. 15. The PCB supporting device 319 is produced in such a manner that after one or more shorter PCB supporting members 316 each of which includes a vibration damping portion 314 formed of a vibration damping rubber and a secondary portion 315 formed of a foamed material such as urethane rubber are placed on the half portion of the first surface 144, a support plate 318 to which a height-adjust plate 317 is fixed is placed on the supporting members 316. The PCB supporting members 316 are attached to the height-adjust plate 317. The respective dimensions of the PCB supporting members 316 in their PCB-support directions are equal to each other and are greater than the respective heights of the shorter ECs 146, but are shorter than the distance between the first surface 144 of the PCB 22 placed on the cushion plate 206 and the lower surface of the frame 210. The height-adjust plate 317 is formed of, e.g., urethane rubber as a sort of a foamed material. The size of the adjust plate 317 is smaller than an area inside a groove 160 formed along an outer periphery of the support plate 318. The adjust plate 317 must not close any bolt holes 166 in which bolts are screwed when the PCB supporting device 319 is attached to the second elevator table 120. The adjust plate 317 has a shape and a size which assure that all the PCB supporting members 316 placed on the half portion of the first surface 144 can be attached to one surface of the plate 317. The adjust plate 317 has a thickness equal to the difference of the dimensions of the PCB supporting members 152, 154, 156 in their PCB-support directions and the dimensions of the PCB supporting members 316 in their PCB-support directions. When the support plate 318 to which the adjust plate 317 is fixed is fitted in the frame 210 and is positioned relative to the PCB holding member 182, the adjust plate 317 is placed on the PCB supporting members 316. The height-adjust plate 317 is used for compensating for the short of the respective lengths of the PCB supporting members 316. Thus, one or more PCB supporting devices for supporting a PCB may be produced using one or more PCB supporting members each having an appropriate length corresponding to the height of the greatest EC mounted on the PCB, and one or more height-adjust plates each having an appropriate thickness corresponding to that height.

Figure 16:
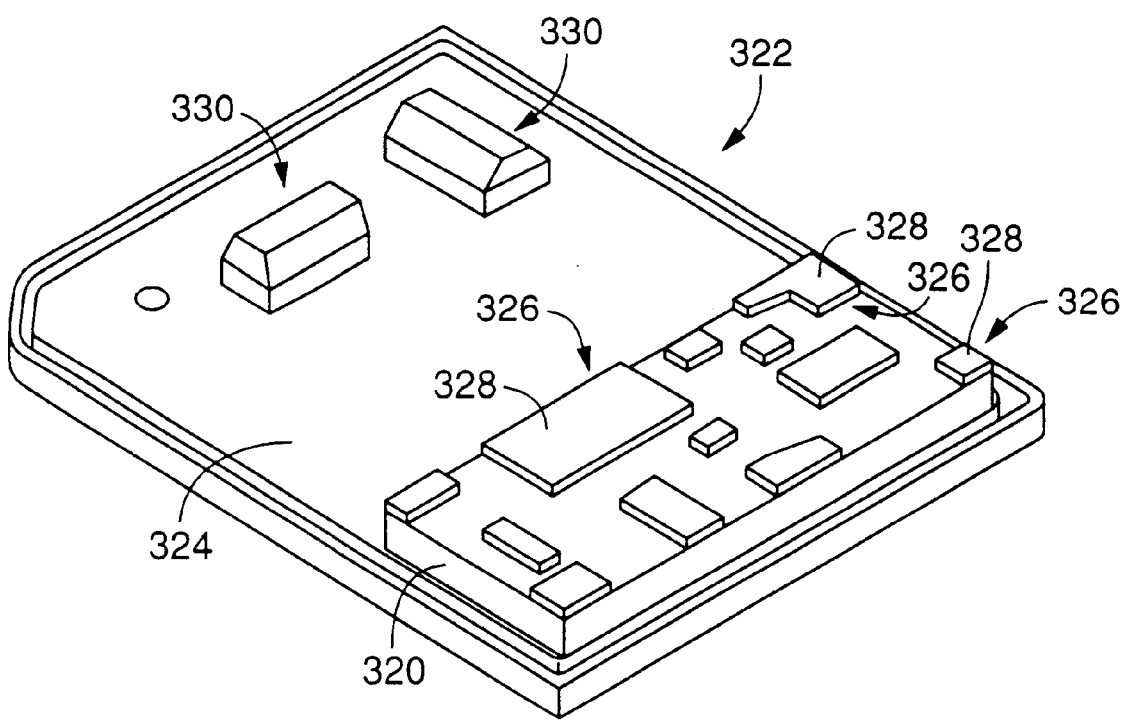
FIG. 16 is a perspective view of a PCB supporting device which is produced using a height-adjust plate.

In the case where one or more shorter ECs 146 are mounted on a portion of one of the two half portions of the first surface 144 that are to be supported by two PCB supporting devices, a height-adjust plate 320 shown in FIG. 16 may be used. The adjust plate 320 has a shape corresponding to the above-indicated portion of the one half portion of the first surface 144, and is fixed to a portion of a support plate 324 to which portion one or shorter PCB supporting members 326 are to be attached. Each of the shorter PCB supporting members 326 includes a vibration damping portion 328 which is formed of a vibration damping rubber and which provides a contact portion; and a tacky layer (not shown). The respective dimensions of the PCB supporting members 326 in their PCB-support directions are equal to each other, and are greater than the respective heights of the shorter ECs 146. The adjust plate 320 is formed of a foamed material such as urethane rubber, and a thickness of the plate 320, i.e., a dimension thereof in a direction parallel to the PCB-support direction of each PCB supporting member 326 is equal to a value obtained by subtracting the length of each supporting member 326 from the distance between the frame 210 and the first surface 144. Thus, the thickness of the adjust plate 320 compensates for the short of the lengths of the supporting members 326. In this case, too, various sorts of PCB supporting members having different lengths and various sorts of height-adjust plates having different thicknesses may be used depending upon the heights of ECs 146.

After the shorter PCB supporting members 326 are placed among the shorter ECs 146 mounted on the first surface 144, one or more taller PCB supporting members 330 are placed among greater ECs 146. Then, the support plate 324 to which the height-adjust plate 320 is fixed is placed on the PCB supporting members 326, 330, so that a PCB supporting device 322 is produced. The shorter supporting members 326 are contacted with, and attached to, the adjust plate 320, and the longer supporting members 330 are directly contacted with, and attached to, the support plate 324. The shorter supporting members 326 can more stably support a PCB than the longer supporting members 330.

Although the jig 180 is intended to produce a PCB supporting device including only one or more long PCB supporting members longer than the height of the greatest EC 146, the jig 180 can be used for producing, with the help of one or more height-adjust plates, a PCB supporting device including only one or more shorter PCB supporting members but not including any long PCB supporting members. In addition, the jig 180 can be used for producing, with the help of one or more height-adjust plates, a PCB supporting device including a plurality of PCB supporting members having different lengths. Thus, the jig 180 is available for producing a more or most appropriate PCB supporting device for each PCB. A height-adjust plate is required to have a shape corresponding to a portion of the first surface 144 of a PCB on which one or more shorter ECs 146 are mounted. Two or more height-adjust plates may be simultaneously used. In the case where three or more sorts of ECs having correspondingly different heights are mounted on a PCB, three or more sorts of PCB supporting members having correspondingly different lengths, and two or more sorts of height-adjust plates having different thicknesses may be used for producing a PCB supporting device appropriate for the PCB. In this case, the single PCB supporting device includes the plurality of sorts of height-adjust plates having the different thicknesses.

The shorter PCB supporting members 316, 326 may be formed of a foamed material, and the height-adjust plates 317, 320 may be formed of a vibration damping rubber.

The previously-described PCB 22 is larger than the frame 210, and the frame 210 functions as an area indicating device. However, the jig 180 can be used for producing one or more PCB supporting devices for supporting a first surface of a PCB whose dimension in the "pin" direction in which the main and secondary PCB positioning pins 186, 188 are distant from each other and/or whose dimension in the direction perpendicular to the "pin" direction are or is smaller than the dimension of the inner space of the frame 210 in the "pin" direction and/or the dimension of the inner space in the above-indicated perpendicular direction, respectively.

Figure 17:
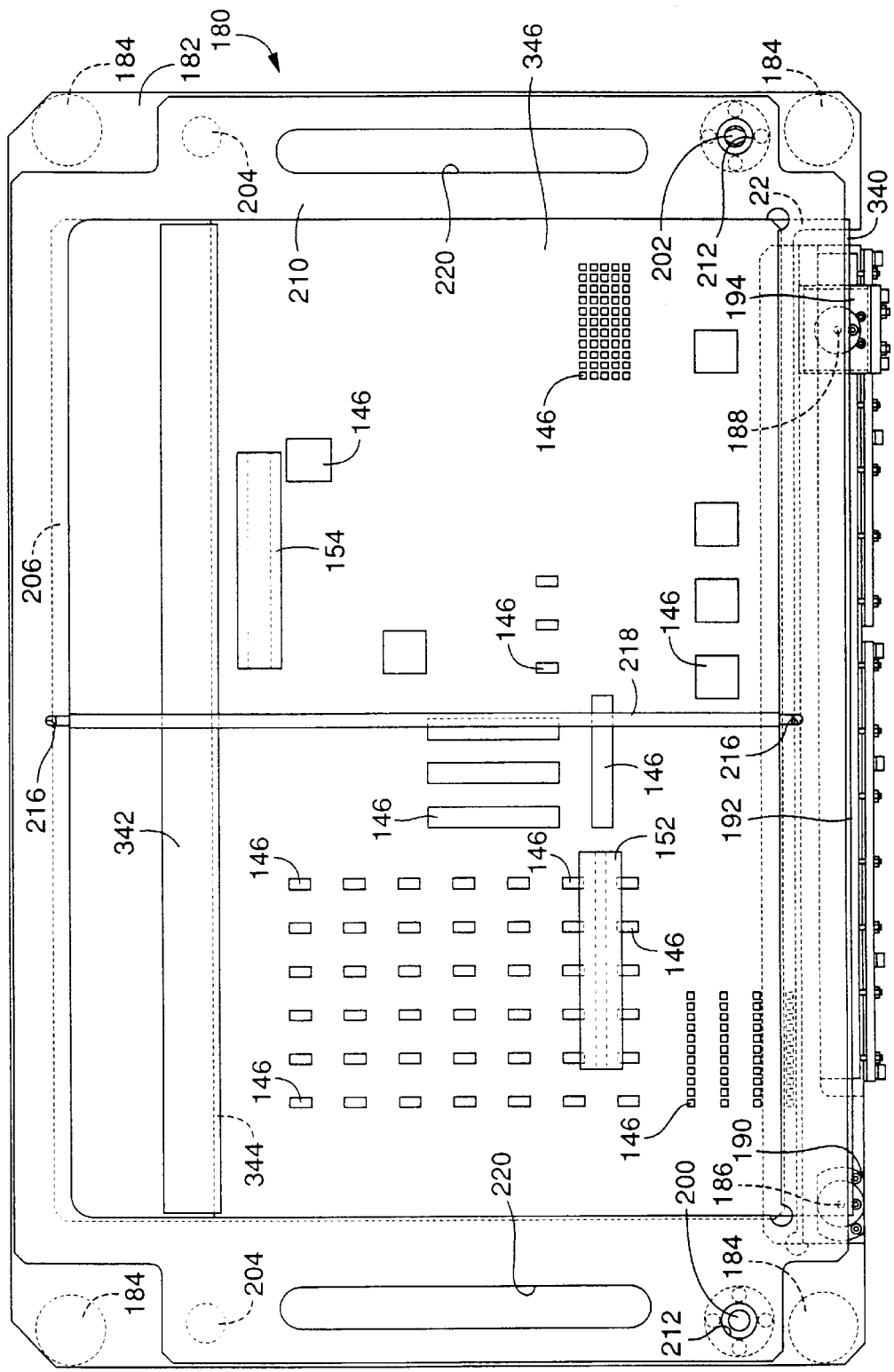
FIG. 17 is a plan view for explaining another manner in which a PCB supporting device is produced using the jig of FIG. 4.
Figure 18:
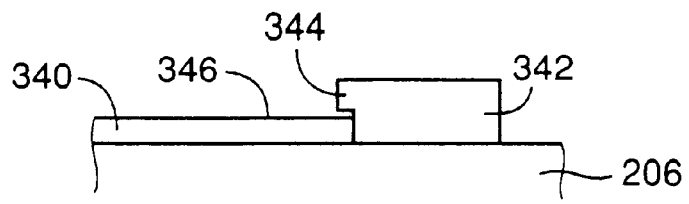
FIG. 18 is a side elevation view of an area indicating member used for producing the PCB supporting device of FIG. 17.

For example, FIG. 17 shows a PCB 340 whose dimension in the above-indicated perpendicular direction is smaller than that of the inner space of the frame 210. In this case, the PCB 340 is positioned by the main and secondary PCB positioning pins 186, 188, and is placed on the cushion plate 206, so that the PCB 340 is held by the PCB holding member 182. Then, a second area indicating member 342 is placed on the cushion plate 206, and the first area indicating member 218 is fitted in the recesses 216 of the frame 210. The second area indicating member 342 has an elongate shape and, as shown in FIGS. 17 and 18, includes a projecting portion 344 extending in a lengthwise direction thereof. When the second indicating member 342 is placed on the cushion plate 206, one side surface of the member 342 that is parallel to the lengthwise direction thereof is contacted with one side surface of the PCB 340, so that the projecting portion 344 of the member 342 projects over an edge portion of the upper or first surface 346 of the PCB 340. Accordingly, when an operator places PCB supporting members on the first surface 346 for producing a PCB supporting device, he or she cannot place any supporting members on the edge portion of the PCB 340 that is covered by the projecting portion 344 of the second area indicating member 342. Thus, no PCB supporting member is placed on the inhibiting area (i.e., the edge portion) on the PCB 340. After the PCB supporting members is or are placed on the first surface 346, two support plates are placed on, and fixed to, the supporting members. Each of the two support plates is just fitted in a corresponding one of the two half spaces defined by the frame 210 and the first area indicating member 218. The thus produced two PCB supporting devices can be positioned relative, and attached, to the second elevator table 120, like the PCB supporting devices 140, 142.

An area indicating member like the second area indicating member 342 may be used for producing one or more PCB supporting devices for supporting a PCB whose dimension in the "pin" direction in which the main and secondary PCB positioning pins 186, 188 are distant from each other, is smaller than that of the PCB 22.

Figure 19:
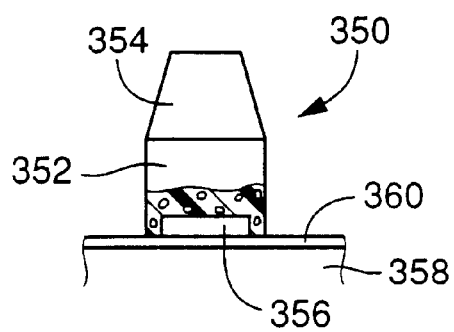
FIG. 19 is a partly cross-sectioned, front elevation view of a PCB supporting member including a permanent magnet as a fixing device.

In each of the illustrated embodiments, a fixing device for fixing the PCB supporting member 152, 154, 156, 270, 280, 290–296, 316, 326, 330 to the support plate 148, 150, 318, 324 is provided by the tacky layer 230, 278, 281, 302. However, the fixing device may be provided by a permanent magnet. For example, FIG. 19 shows a PCB supporting member 350 including a permanent magnet 356 which is embedded in one end surface of a secondary portion 352 to the other end surface of which a vibration damping portion 354 is fixed. In this case, a support plate 358 is formed of a magnetic material such as iron. Like the PCB supporting member 152, the PCB supporting member 350 is placed on a portion of a first surface of a PCB that is free from ECs, such that the vibration damping portion 354 of the member 350 is contacted with that EC-free portion. Then, the support plate 358 is placed on the supporting member 350. The support plate 358 may be placed directly on the supporting member 350. However, since the supporting member 350 is attracted to the support plate 358, the member 350 may be moved upward off the PCB. To solve this problem, a hold-down plate 360 formed of a non-magnetic material such as aluminum or a synthetic resin is first placed on the supporting member 350, and then the support plate 358 is placed on the hold-down plate 360. The PCB supporting member 350 is attracted and fixed to the support plate 358 via the hold-down plate 360.

Figure 20:
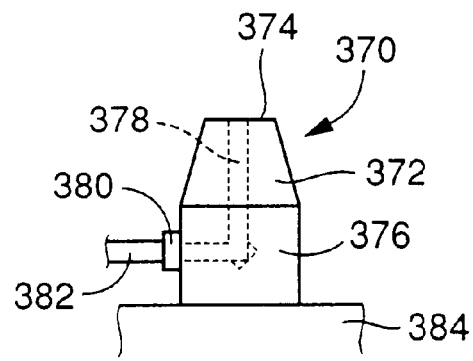
FIG. 20 is a front elevation view of a PCB supporting member having the function of applying a negative-air-pressure suction to a PCB.

It is possible to employ a PCB supporting member which not only supports a PCB by contacting a first surface of the PCB but also sucks and holds the PCB by applying a negative air pressure to the first surface of the same. For example, FIG. 20 shows a PCB supporting member 370 including an air passage 378 which opens in a contact surface 374 of a vibration damping portion 372 as a contact portion, which extends in the vibration damping portion 372 and a secondary portion 376, and which opens in an outer circumferential surface of the secondary portion 376. A hose 382 is attached via a connector 380 to the opening of the air passage 378 in the outer surface of the secondary portion 376. Respective hoses 382 attached to a plurality of PCB supporting members 370 are connected to a vacuum (negative air pressure) source (not shown) via a common connector and a common solenoid-operated direction-control valve (not shown). When the direction-control valve is switched, the respective air passages 378 of the PCB supporting members 370 are selectively communicated with the vacuum source, so that air in the air passages 378 is sucked and the PCB is supported flat by the contact surfaces 374 of the vibration damping portions 372. Alternatively, the air passages 378 are communicated with the atmosphere, so that the PCB is released from the suction of the PCB supporting members 370. Each of the PCB supporting members 370 is fixed to a support plate 384, with an appropriate fixing device such as a tacky layer or a permanent magnet.

Figure 21:
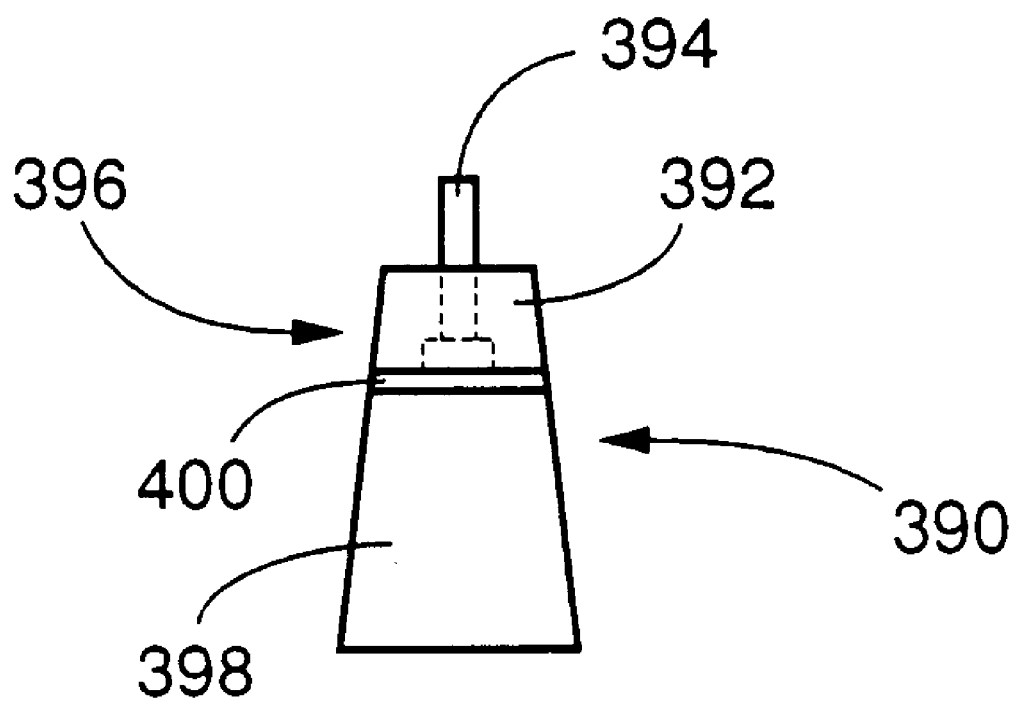
FIG. 21 is a front elevation view of another PCB supporting member.

It is possible to employ a PCB supporting member including a head portion including a contact portion which contacts a first surface of a PCB; and a base portion which supports the head portion and includes a fixing device for fixing the PCB supporting member to a support plate, and which is separate from the head portion. For example, FIG. 21 shows a PCB supporting member 390 including a head portion 396 including a vibration damping portion 392 formed of a vibration damping rubber, and a metallic support pin 394 which provides the contact portion and which projects from the vibration damping portion 392; a base portion 398 which is formed of, e.g., a foamed material such as urethane rubber and which supports the head portion 396; and a tacky later 400 which connects the head portion 396 to the base portion 398. A second tacky layer (not shown) is formed on one end surface of the base portion 398 that is opposite to the other end surface to which the head portion 396 is connected via the first tacky layer 400. The PCB supporting member 390 is fixed to a support plate by the second tacky layer. The first tacky layer 400 can be used repeatedly. In the case where a PCB of a specific sort for which the head portion 396 cannot be used is used, the head portion 396 may be removed from the base portion 398, and be replaced with a different head portion which does not include a support pin 394 and includes a vibration damping portion as a contact portion. Thus, the base portion 398 can be commonly used for the two different head portions. The first tacky layer 400 provides a connecting device which connects the head and base portions 396, 398 to each other such that the two portions 396, 398 are separable from each other. The first tacky layer 400 is formed on the base portion 398, the end surface of the head portion 396 that is connected to the base portion 398 by the tacky layer 400 exhibits a lower degree of tackiness to the tacky layer 400 than that of the base portion 398. However, the first tacky layer 400 may be provided on the head portion 396. The base portion 398 has a trapezoidal cross section. However, the base portion 398 may be replaced with one which has an appropriate one of known shapes such as a cylindrical shape. The head portion 396 may be replaced with one which includes a vibration damping portion having an appropriate one of various shapes including the respective shapes of the vibration damping portions 298 of the PCB supporting members 290–296 shown in FIGS. 12A–12D. The connecting device is not limited to the tacky layer 400, but may be provided by at least one engaging projection provided on one of the head and base portions 396, 398 and at least one engaging recess which is formed in the other of the head and base portions and which is disengageably engaged with the engaging projection.

In the majority of the illustrated embodiments, the PCB supporting member 152–156, 270, 280, 290–296, 316, 326, 330, 390 is fixed to the support plate 148, 150, 318, 324 by the tacky layer 230, 278, 281, 302, 400. However, one or more PCB supporting members may be fixed to a support plate by an adhesive, or an adhesive layer. In this case, no adhesive is applied to any PCB supporting members. After the PCB supporting members are placed on a first surface of a PCB, an adhesive is applied to one entire surface of the support plate and, before the adhesive is dried up, the support plate is placed on the PCB supporting members such that the adhesive-applied surface of the support plate are contacted with the supporting members. Thus, the supporting members are fixed to the support plate. After the adhesive is completely dried up, the thus obtained PCB supporting device is used.

It is possible to use a kit for providing a plurality of PCB supporting members each of which includes, in addition to a vibration damping portion formed of a vibration damping rubber, a secondary portion formed of, e.g., a foamed material. Moreover, it is possible to use a kit for providing a plurality of PCB supporting members each of which has an appropriate one of various cross-section shapes (e.g., trapezoid) other than rectangle or square. For example, it is possible to use a kit including a plurality of PCB supporting members which are identical with the PCB supporting member 152 shown in FIG. 2; and a common peelable sheet to which the PCB supporting members are attached.

A fixing device for fixing a PCB supporting member to a support plate may be provided by a repeatedly usable member, such as a pair of fastening clothes, other than the tacky layer or the permanent magnet.

It is possible to use a PCB supporting member having a circular, horizontal cross section.

It is not essentially required that a contact portion of a PCB supporting member that contacts a PCB be provided by a vibration damping portion thereof. The contact portion of the supporting member may be formed of a material (e.g., a foamed material) other than vibration damping rubber. In this case, the vibration damping portion of the PCB supporting member, formed of a vibration damping rubber, may be provided by at least a portion of the other portion of the supporting member than the contact portion thereof.

In some of the illustrated embodiments, the jig 180 is commonly used for producing, using the support plates 148, 150, each of a plurality of sorts of PCB supporting devices for supporting a plurality of sorts of PCBs having different sizes. In each embodiment, the support plates 148, 150 are positioned by the frame 210. However, various frames having different sizes and various support plates having different sizes may be used depending upon the different sizes of various PCBs. In this case, an appropriate one of the various frames and an appropriate one of the various support plates are selected depending upon the size of each PCB, such that the selected support plate is just fitted in an inner space of the selected frame and is positioned by the frame.

It is possible to use a kit for providing a plurality of PCB supporting members which include respective contact portions which contact respective portions of the first surface 144 of the PCB 22 and which have an identical shape and an identical dimension or size; or a kit for providing a plurality of PCB supporting members which include respective contact portions which contact respective portions of the first surface 144 of the PCB 22 and which comprise a plurality of sorts of PCB supporting members including respective contact portions which are different from each other in at least one of shape and dimension (or size).

In the illustrated embodiments, it is assumed that the ECs 146 mounted on the first surface 144 of the PCB 22 include the greatest EC 146 that has the greatest height of all sorts of ECs 146 supplied from the EC supplying device 12, the jig 180 is intended for producing a PCB supporting device including one or more PCB supporting members each longer than the height of the greatest EC 146, and the PCB positioning and supporting device 26 is intended for supporting the PCB 22 with the help of the thus produced PCB supporting device. However, the jig 180 may be replaced with another jig which is capable of producing a PCB supporting device corresponding to the highest one of all ECs 146 mounted on a first surface of each PCB. For example, it is possible to use a jig including a frame having a great thickness which assures that a support plate can be positioned by the frame, at an appropriate position in a direction perpendicular to the plane of the PCB. In this jig, a pair of main and secondary frame positioning pin are replaceable with another pair, depending upon the length of one or more PCB supporting members. In the case where all Ago 0 the ECs mounted on the first surface of the PCB are short, one or more short PCB supporting members are used, and the support plate is positioned by the frame and is placed on the short supporting members, at a position nearer to the PCB, than the position at which the support plate would be placed on one or more long PCB supporting members for supporting the PCB 22 on which the greatest EC 146 is mounted. In this case, the PCB P-S device 126 is replaced with another device which is capable of changing the height position of the second elevator table 120 to each of three or more steps, or steplessly or continuously, so that the PCB supporting device including only the short PCB supporting members can support the PCB.

The principle of the present invention directed to the PCB supporting method and others may be applied to an EC mounting system in which a PCB is linearly moved in a first direction and an EC mounting head is linearly moved in a second direction perpendicular to the first direction on a plane; or an EC mounting system in which a PCB is not moved and an EC mounting head is moved to an arbitrary position on a plane. In the case where a plurality of EC mounting heads are employed, the plurality of EC mounting heads may be provided on a head moving device, so as to be moved with the head moving device along a plane. In this case, the EC mounting heads may not be moved on the head moving device in any directions parallel to the plane. Alternatively, the plurality of EC mounting heads may be employed in an EC mounting device such that the EC mounting heads are rotated about a common axis line and are sequentially positioned at each of a plurality of operation positions. In the last case, the EC mounting device may be moved by a moving device to an arbitrary position on a plane.

Each of the EC feeders 32 may be replaced with an appropriate one of various sorts of EC feeders, such as a feeder which stores ECs in a casing and feeds the ECs in an array to an EC-supply portion thereof from which the ECs are supplied, one by one. The feeding of the array of ECs from the casing to the EC-supply portion may be performed by vibrating the casing, utilizing the inclination of the casing, applying an air flow to the ECs stored in the casing, or circulating one or more conveyor belts for conveying the ECs, or combining two or more of those manners.

Each of the EC feeders 32 includes an EC feeding device and an EC storing device provided on a common main frame thereof. However, it is possible to use a plurality of EC feeders whose respective EC storing devices are provided separately from respective EC feeding devices thereof. In this case, the EC storing devices may not be moved, and only the EC feeding devices may be moved so that respective EC-supply portions of the EC feeding devices may be sequentially positioned at an EC-supply position. Alternatively, the EC storing devices may be moved to follow the EC feeding devices being moved.

It is to be understood that the present invention may be embodied with other changes, improvements, and modifications that may occur to the person skilled in the art without departing from the spirit and scope of the invention defined in the appended claims.

What is claimed is:

1. A printed-circuit-board supporting device for contacting at least two portions of a first one of opposite surfaces of a printed circuit board, and thereby supporting the printed circuit board on a side of the first surface, comprising:

at least one support plate; and at least two board supporting members which are fixable to at least two portions of the support plate, respectively, such that said at least two board supporting members contact and support said at least two portions of the first surface of the printed circuit board, respectively, and such that a vacant space is left between the board supporting members fixed to the support plate and supporting the printed circuit board, each of the board supporting members including a vibration damping portion formed of a vibration damping rubber.

2. A device according to claim 1, wherein the vibration damping portion of said each of the board supporting members comprises a contact portion which, contacts a corresponding one of the plurality of portions of the first surface of the printed circuit board.

3. A device according to claim 1, wherein the support plate comprises at least one reference portion for being positioned relative to the printed circuit board.

4. A device according to claim 1, wherein the vibration damping rubber has a less than 10% impact resilience.

5. A printed-circuit-board supporting member for contacting a portion of a first one of opposite surfaces of a printed circuit board, and thereby supporting the printed circuit board on a side of the first surface. comprising:

a vibration damping portion formed of a vibration damping rubber, the vibration damping rubber having a less than 10% impact resilience: and a fixing device which fixes one end of the printed-circuit-board supporting member to a support plate, the fixing device being provided at said one end of the supporting member, the vibration damping portion providing a complete transverse portion between said one end of the supporting member and a contact end of the supporting member that contacts said portion of the first surface of the printed circuit board.

6. A printed-circuit-board supporting member according to claim 5, wherein the fixing device comprises a tacky layer formed on an end surface of said one end.

7. A printed-circuit-board supporting member according to claim 5, wherein the fixing device comprises a permanent magnet provided at said one end.

8. A printed-circuit-board supporting member according to claim 5, wherein the vibration damping portion has the contact end which contacts said portion of the first surface of the printed circuit board, and wherein the printed-circuit-board supporting member further comprises a secondary portion which supports the vibration damping portion.

9. A printed-circuit-board supporting member according to claim 8, wherein the secondary portion is formed of a foamed material.

10. A printed-circuit-board supporting member according to claim 5, further comprising a support pin which projects from an end surface of the printed-circuit-board supporting member which surface is opposite to said one end, the support pin having the contact end.

11. A printed-circuit-board supporting member according to claim 5, further comprising a contact portion which includes the contact end and which is opposite to said one end, the contact portion having at least one recess so that a profile of a transverse cross section of the contact portion includes at least one inwardly deformed portion corresponding to said at least one recess.

12. A printed-circuit-board supporting member according to claim 5, further comprising a head portion having the contact end; a base portion which supports the head portion and includes the fixing device and which is provided separately from the head portion; and a connecting device which connects the head portion and the base portion to each other such that the head portion and the base portion are separable from each other.

13. A kit comprising:

a plurality of printed-circuit-board supporting members each of which comprises a vibration damping portion formed of a vibration damping rubber, and a fixing device which fixes one end of said each supporting member to a support plate, the fixing device being provided at said one end of said each supporting member, the vibration damping portion providing a complete transverse portion between said one end of said each supporting member and a contact end of said each supporting member that contacts a portion of a first one of opposite surfaces of a printed circuit board and thereby supports the printed circuit board on a side of the first surface; and a common base member which supports the printed-circuit-board supporting members via the respective fixing devices thereof, such that each of the printed-circuit-board supporting members is detachable from the common base member and such that substantially no space is presented between the printed-circuit-board supporting members.

14. A kit according to claim 13, wherein the plurality of printed-circuit-board supporting members include respective contact portions which are opposite to the respective one ends thereof, which contact respective portions of the first surface of the printed circuit board, and which have an identical shape and an identical dimension.

15. A kit according to claim 13, wherein the plurality of printed-circuit-board supporting members include respective contact portions which are opposite to the respective one ends thereof and which contact respective portions of the first surface of the printed circuit board, the plurality of printed-circuit-board supporting members comprising a plurality of sorts of printed-circuit-board supporting members including respective contact portions which are different from each other in at least one of shape and dimension.

16. A kit according to claim 13, further comprising a fitable member which is detachably fitable on an outer surface of a contact portion of at least one of the printed-circuit-board supporting members, so as to increase an apparent cross-section area of the contact portion, when the contact portion of said one supporting member is contacted with a portion of the first surface of the printed circuit board so as to produce a printed-circuit-board supporting device.

17. A kit according to claim 13, wherein the vibration damping rubber has a less than 10% impact resilience.

18. A kit according to claim 13, wherein the printed-circuit-board supporting members comprise at least four printed-circuit-board supporting members including at least two first printed-circuit-board supporting members arranged in a first direction parallel to the common base member, and at least two second printed-circuit-board supporting members arranged in a second direction parallel to the common base member and perpendicular to the first direction, and wherein the common base member supports the four printed-circuit-board supporting members such that substantially no space is present between the first printed-circuit-board supporting members arranged in the first direction and between the second printed-circuit-board supporting members arranged in the second direction.

19. A kit, comprising:

a plurality of printed-circuit-board supporting members each of which comprises a vibration damping portion formed of a vibration damping rubber, and a fixing device which fixes one end of said each supporting member to a support plate, the fixing device being provided at said one end of said each supporting member, the vibration damping portion providing a complete transverse portion between said one end of said each supporting member and a contact end of said each supporting member that contacts a portion of a first one of opposite surfaces of a printed circuit board and thereby supports the printed circuit board on a side of the first surface; and a common base member which supports the printed-circuit-board supporting members via the respective fixing devices thereof, such that each of the printed-circuit-board supporting members is detachable from the common base member, wherein the fixing device of said each of the printed-circuit-board supporting members comprises a tacky layer formed on an end surface of each supporting member as the one end thereof, and the common base member exhibits a lower degree of tackiness to the tacky layer than said end surface.

* * * * *